United States Patent
Inada et al.

(10) Patent No.: US 9,880,336 B2
(45) Date of Patent: *Jan. 30, 2018

(54) LIGHT-EMITTING DEVICE INCLUDING PHOTOLUMINESCENT LAYER

(71) Applicant: Panasonic Intellectual Property Management Co., Ltd., Osaka (JP)

(72) Inventors: Yasuhisa Inada, Osaka (JP); Taku Hirasawa, Kyoto (JP); Yoshitaka Nakamura, Osaka (JP); Akira Hashiya, Osaka (JP); Mitsuru Nitta, Kyoto (JP); Takeyuki Yamaki, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/215,595

(22) Filed: Jul. 21, 2016

(65) Prior Publication Data

US 2016/0327716 A1 Nov. 10, 2016

Related U.S. Application Data

(63) Continuation of application No. PCT/JP2015/000813, filed on Feb. 20, 2015.

(30) Foreign Application Priority Data

Feb. 28, 2014 (JP) .................................. 2014-037992
Jul. 29, 2014 (JP) .................................. 2014-154135

(51) Int. Cl.
*F21V 8/00* (2006.01)
*F21S 2/00* (2016.01)
(Continued)

(52) U.S. Cl.
CPC .............. *G02B 6/0003* (2013.01); *F21S 2/00* (2013.01); *G02B 5/18* (2013.01); *G02B 6/00* (2013.01);
(Continued)

(58) Field of Classification Search
CPC ...... G02B 6/0003; G02B 6/00; G02B 6/0038; G02B 6/0055; G02B 5/18; F21S 2/00;
(Continued)

(56) References Cited

U.S. PATENT DOCUMENTS 5,517,039 A 5/1996 Holonyak, Jr. et al.
5,732,102 A 3/1998 Bouadma
(Continued)

FOREIGN PATENT DOCUMENTS

JP 9-073807 3/1997
JP 11-283751 10/1999
(Continued)

OTHER PUBLICATIONS

The Extended European Search Report dated Dec. 16, 2016 for the related European Patent Application No. 14883764.4.
(Continued)

*Primary Examiner* — Mary Ellen Bowman
(74) *Attorney, Agent, or Firm* — McDermott Will & Emery LLP

(57) ABSTRACT

A light-emitting device includes a photoluminescent layer, a light-transmissive layer located on the photoluminescent layer, and a multilayer mirror layered together with the photoluminescent layer and the light-transmissive layer. At least one of the photoluminescent layer and the light-transmissive layer has a submicron structure. The submicron structure has at least projections or recesses arranged perpendicular to the thickness direction of the photoluminescent layer. The photoluminescent layer emits light including
(Continued)

first light having a wavelength $\lambda_a$ in air. The distance $D_{int}$ between adjacent projections or recesses and the refractive index $n_{wav-a}$ of the photoluminescent layer for the first light satisfy $\lambda_a/n_{wav-a}<D_{int}<\lambda_a$. A thickness of the photoluminescent layer, the refractive index $n_{wav-a}$, and the distance $D_{int}$ are set to limit a directional angle of the first light emitted from the light emitting surface.

25 Claims, 26 Drawing Sheets

(51) Int. Cl.
| | |
|---|---|
| G02B 5/18 | (2006.01) |
| G02B 6/00 | (2006.01) |
| H01L 33/50 | (2010.01) |
| H01L 27/15 | (2006.01) |
| H01L 33/46 | (2010.01) |
| H01L 33/22 | (2010.01) |

(52) U.S. Cl.
CPC ......... *G02B 6/0038* (2013.01); *G02B 6/0055* (2013.01); *H01L 27/156* (2013.01); *H01L 33/46* (2013.01); *H01L 33/50* (2013.01); *H01L 33/22* (2013.01)

(58) Field of Classification Search
CPC ....... H01L 27/156; H01L 33/46; H01L 33/50; H01L 33/22
See application file for complete search history.

(56) References Cited

U.S. PATENT DOCUMENTS

| | | | |
|---|---|---|---|
| 6,728,034 B1 | 4/2004 | Nakanishi et al. | |
| 7,619,357 B2* | 11/2009 | Onishi | H01L 51/5262 313/110 |
| 7,699,482 B2* | 4/2010 | Noguchi | H01L 51/5262 362/244 |
| 8,227,966 B2* | 7/2012 | Wakabayashi | H01L 51/5262 313/112 |
| 8,619,363 B1 | 12/2013 | Coleman | |
| 9,515,239 B2* | 12/2016 | Inada | H01L 33/505 |
| 2002/0180348 A1 | 12/2002 | Oda et al. | |
| 2003/0021314 A1 | 1/2003 | Yoshida et al. | |
| 2003/0169792 A1 | 9/2003 | Kim | |
| 2004/0141108 A1 | 7/2004 | Tanaka et al. | |
| 2004/0233534 A1 | 11/2004 | Nakanishi et al. | |
| 2006/0039433 A1* | 2/2006 | Simpson | H01S 3/0635 372/50.1 |
| 2006/0088066 A1 | 4/2006 | He | |
| 2007/0031097 A1 | 2/2007 | Heikenfeld et al. | |
| 2007/0103931 A1 | 5/2007 | Lee et al. | |
| 2007/0138479 A1 | 6/2007 | Yamazaki et al. | |
| 2007/0153860 A1 | 7/2007 | Chang-Hasnain et al. | |
| 2008/0069497 A1 | 3/2008 | Tissot et al. | |
| 2008/0149916 A1 | 6/2008 | Baba et al. | |
| 2008/0258160 A1 | 10/2008 | Do | |
| 2008/0303419 A1 | 12/2008 | Fukuda | |
| 2009/0021153 A1 | 1/2009 | Lee et al. | |
| 2009/0040745 A1 | 2/2009 | Nemchuk | |
| 2009/0129115 A1 | 5/2009 | Fine et al. | |
| 2009/0190068 A1 | 7/2009 | Kawamura | |
| 2009/0206325 A1 | 8/2009 | Biwa et al. | |
| 2009/0267092 A1 | 10/2009 | Fukshima et al. | |
| 2009/0286337 A1 | 11/2009 | Lee et al. | |
| 2010/0074284 A1 | 3/2010 | Aizawa et al. | |
| 2010/0142189 A1 | 6/2010 | Hong et al. | |
| 2010/0164365 A1 | 7/2010 | Yoshino et al. | |
| 2010/0246210 A1 | 9/2010 | Yashiro | |
| 2010/0277887 A1 | 11/2010 | Su et al. | |
| 2011/0101359 A1 | 5/2011 | Kim et al. | |
| 2011/0198645 A1 | 8/2011 | Jo et al. | |
| 2012/0018705 A1 | 1/2012 | Takazoe et al. | |
| 2012/0106127 A1 | 5/2012 | Hattori et al. | |
| 2012/0119638 A1 | 5/2012 | Sato et al. | |
| 2012/0176766 A1 | 7/2012 | Natsumeda | |
| 2012/0224378 A1 | 9/2012 | Koike et al. | |
| 2012/0286258 A1 | 11/2012 | Naraoka et al. | |
| 2013/0069046 A1 | 3/2013 | Ishizuya | |
| 2013/0181195 A1 | 7/2013 | Cho et al. | |
| 2013/0208327 A1 | 8/2013 | Bolle et al. | |
| 2013/0277703 A1 | 10/2013 | Matsuzaki | |
| 2013/0308102 A1 | 11/2013 | Natsumeda et al. | |
| 2014/0022818 A1 | 1/2014 | Natsumeda et al. | |
| 2014/0071683 A1 | 3/2014 | Hamada et al. | |
| 2014/0092620 A1 | 4/2014 | Tissot | |
| 2014/0185316 A1 | 7/2014 | Kim et al. | |
| 2014/0306176 A1 | 10/2014 | Chiu et al. | |
| 2014/0362604 A1 | 12/2014 | Masuda | |
| 2015/0249183 A1 | 9/2015 | Hirasawa et al. | |
| 2015/0249186 A1 | 9/2015 | Inada et al. | |
| 2015/0249187 A1 | 9/2015 | Inada et al. | |
| 2016/0265746 A1 | 9/2016 | Hirasawa et al. | |
| 2016/0265747 A1 | 9/2016 | Nagao et al. | |
| 2016/0265749 A1 | 9/2016 | Inada | |
| 2017/0012232 A1 | 1/2017 | Kataishi et al. | |
| 2017/0075169 A1 | 3/2017 | Hayama | |

FOREIGN PATENT DOCUMENTS

| | | |
|---|---|---|
| JP | 2001-059905 | 3/2001 |
| JP | 2001-155520 | 6/2001 |
| JP | 2007-103901 | 4/2007 |
| JP | 2007-240641 | 9/2007 |
| JP | 2008-130279 | 6/2008 |
| JP | 2008-521211 | 6/2008 |
| JP | 2008-227458 | 9/2008 |
| JP | 2009-140894 | 6/2009 |
| JP | 2010-015874 | 1/2010 |
| JP | 2010-033772 | 2/2010 |
| JP | 2010-097178 | 4/2010 |
| JP | 2010-199357 | 9/2010 |
| JP | 2010-210824 | 9/2010 |
| JP | 2010-231941 | 10/2010 |
| JP | 2010-237311 | 10/2010 |
| JP | 2011-166148 | 8/2011 |
| JP | 2012-093454 | 5/2012 |
| JP | 2012-109334 | 6/2012 |
| JP | 2012-109400 | 6/2012 |
| JP | 2012-182376 | 9/2012 |
| JP | 2013-183020 | 9/2013 |
| JP | 2014-075584 | 4/2014 |
| JP | 2014-082401 | 5/2014 |
| JP | 2014-092645 | 5/2014 |
| JP | 2014-523603 | 9/2014 |
| WO | 2007/034827 | 3/2007 |
| WO | 2007/091687 | 8/2007 |
| WO | 2009/005311 | 1/2009 |
| WO | 2009/099211 | 8/2009 |
| WO | 2011/040528 | 4/2011 |
| WO | 2012/049905 | 4/2012 |
| WO | 2012/108384 | 8/2012 |
| WO | 2012/137584 | 10/2012 |
| WO | 2013/084442 | 6/2013 |
| WO | 2013/125567 | 8/2013 |
| WO | 2013/172025 | 11/2013 |
| WO | 2014/024218 | 2/2014 |
| WO | 2014/119783 | 8/2014 |
| WO | 2015/045886 | 4/2015 |

OTHER PUBLICATIONS

Specification of U.S. Appl. No. 15/446,453, filed Mar. 1, 2017.
Non-Final Office Action issued in U.S. Appl. No. 15/216,669, dated Apr. 14, 2017.
International Search Report of PCT application No. PCT/JP2015/000813 dated May 19, 2015.
Non-final Office Action issued in U.S. Appl. No. 14/618,591, dated Nov. 9, 2015.

(56) References Cited

OTHER PUBLICATIONS

Final Office Action issued in U.S. Appl. No. 14/618,591, dated May 19, 2016.
Non-final Office Action issued in U.S. Appl. No. 14/618,254, dated Feb. 3, 2016.
Non-Final Office Action issued in U.S. Appl. No. 14/621,729, dated Mar. 9, 2016.
Final Office Action issued in U.S. Appl. No. 14/621,729, dated Sep. 28, 2016.
International Search Report of PCT application No. PCT/JP2015/000810 dated Apr. 7, 2015.
International Search Report of PCT application No. PCT/JP2015/000811 dated Apr. 7, 2015.
International Search Report of PCT application No. PCT/JP2015/000812 dated Apr. 7, 2015.
International Search Report of PCT application No. PCT/JP2015/000814 dated May 26, 2015.
International Search Report of PCT application No. PCT/JP2015/000815 dated Apr. 7, 2015.
International Search Report of PCT application No. PCT/JP2014/004324 dated Nov. 25, 2014; with English translation.
Specification of U.S. Appl. No. 15/166,123, filed May 26, 2016.
Specification of U.S. Appl. No. 15/169,771, filed Jun. 1, 2016.
Specification of U.S. Appl. No. 15/206,273, filed Jul. 10, 2016.
Specification of U.S. Appl. No. 15/214,523, filed Jul. 20, 2016.
Specification of U.S. Appl. No. 15/214,803, filed Jul. 20, 2016.
Specification of U.S. Appl. No. 15/214,837, filed Jul. 20, 2016.
Specification of U.S. Appl. No. 15/215,592, filed Jul. 21, 2016.
Specification of U.S. Appl. No. 15/215,599, filed Jul. 21, 2016.
Specification of U.S. Appl. No. 15/216,669, filed Jul. 21, 2016.
Specification of U.S. Appl. No. 15/216,686, filed Jul. 21, 2016.
Specification of U.S. Appl. No. 15/219,462, filed Jul. 26, 2016.
Non-Final Office Action issued in U.S. Appl. No. 15/169,771, dated Aug. 16, 2017.
Non-Final Office Action issued in U.S. Appl. No. 15/214,803, dated Aug. 8, 2017.
Non-Final Office Action issued in U.S. Appl. No. 15/214,837, dated Sep. 12, 2017.
Non-Final Office Action issued in U.S. Appl. No. 15/215,599, dated Aug. 25, 2017.
Non-Final Office Action issued in U.S. Appl. No. 15/219,462, dated Sep. 26, 2017.
Notice of Allowance issued in U.S. Appl. No. 15/169,771, dated Oct. 24, 2017.

\* cited by examiner

LIGHT-EMITTING DEVICE INCLUDING PHOTOLUMINESCENT LAYER

BACKGROUND

1. Technical Field

The present disclosure relates to a light-emitting device including a photoluminescent layer.

2. Description of the Related Art

Optical devices, such as lighting fixtures, displays, and projectors, that output light in the necessary direction are required for many applications. Photoluminescent materials, such as those used for fluorescent lamps and white light-emitting diodes (LEDs), emit light in all directions. Thus, those materials are used in combination with optical elements such as reflectors and lenses to output light only in a particular direction. For example, Japanese Unexamined Patent Application Publication No. 2010-231941 discloses an illumination system including a light distributor and an auxiliary reflector to provide sufficient directionality.

SUMMARY

In one general aspect, the techniques disclosed here feature a light-emitting device that includes a photoluminescent layer having a first surface perpendicular to a thickness direction thereof, an area of the first surface being larger than a sectional area of the photoluminescent layer perpendicular to the first surface; a light-transmissive layer located on the photoluminescent layer, at least one of the photoluminescent layer and the light-transmissive layer having a submicron structure; and a multilayer mirror layered together with the photoluminescent layer and the light-transmissive layer. The submicron structure has at least projections or recesses arranged perpendicular to the thickness direction of the photoluminescent layer. The photoluminescent layer emits light including first light having a wavelength $\lambda_a$ in air. At least one of the photoluminescent layer and the light-transmissive layer has a light emitting surface perpendicular to the thickness direction of the photoluminescent layer, the first light being emitted from the light emitting surface. A distance $D_{int}$ between adjacent projections or recesses and a refractive index $n_{wav-a}$ of the photoluminescent layer for the first light satisfy $\lambda_a/n_{wav-a}<D_{int}<\lambda_a$. A thickness of the photoluminescent layer, the refractive index $n_{wav-a}$, and the distance $D_{int}$ are set to limit a directional angle of the first light emitted from the light emitting surface.

It should be noted that general or specific embodiments may be implemented as a device, an apparatus, a system, a method, or any elective combination thereof.

BRIEF DESCRIPTION OF THE DRAWINGS

FIG. 17A illustrates a one-dimensional periodic structure having a period $p_x$ in the x direction, FIG. 17B illustrates a two-dimensional periodic structure having a period $p_x$ in the x direction and a period $p_y$ in the y direction, FIG. 17C illustrates the wavelength dependence of light absorptivity in the structure in FIG. 17A, and FIG. 17D illustrates the wavelength dependence of light absorptivity in the structure in FIG. 17B;

DETAILED DESCRIPTION

Figure 1A:
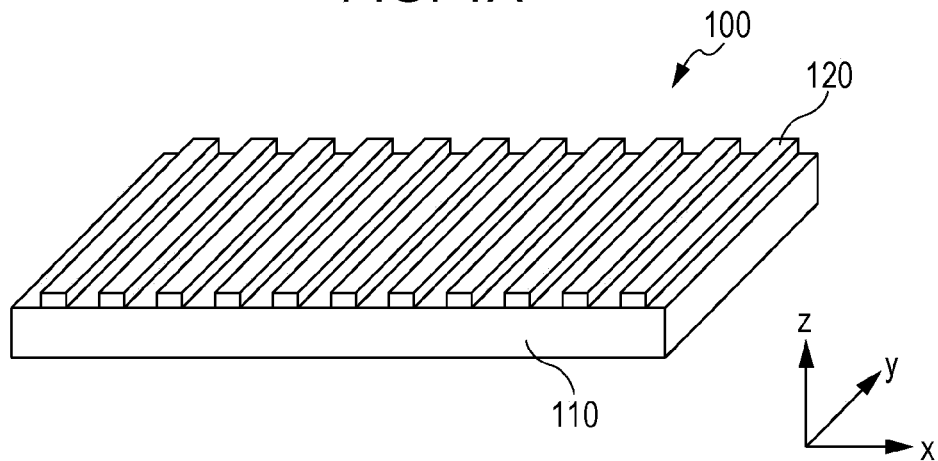
FIG. 1A is a perspective view of the structure of a light-emitting device according to an embodiment.

Optical devices including optical elements such as reflectors and lenses need to be larger to ensure sufficient space for these optical elements. Accordingly, it is desirable to eliminate or reduce the size of these optical elements.

The present disclosure includes the following light-emitting devices and light-emitting apparatuses:

[Item 1] A light-emitting device including
a photoluminescent layer,
a light-transmissive layer located on or near the photoluminescent layer, and a submicron structure that is formed on at least one of the photoluminescent layer and the light-transmissive layer and that extends in a plane of the photoluminescent layer or the light-transmissive layer, wherein the submicron structure has projections or recesses, light emitted from the photoluminescent layer includes first light having a wavelength $\lambda_a$ in air, and the distance $D_{int}$ between adjacent projections or recesses and the refractive index $n_{wav-a}$ of the photoluminescent layer for the first light satisfy $\lambda_a/n_{wav-a} < D_{int} < \lambda_a$.

[Item 2] The light-emitting device according to Item 1, wherein the submicron structure includes at least one periodic structure having at least the projections or recesses, and the at least one periodic structure includes a first periodic structure having a period $p_a$ that satisfies $\lambda_a/n_{wav-a} < p_a < \lambda_a$.

[Item 3] The light-emitting device according to Item 1 or 2, wherein the refractive index $n_{t-a}$ of the light-transmissive layer for the first light is lower than the refractive index $n_{wav-a}$ of the photoluminescent layer for the first light.

[Item 4] The light-emitting device according to any one of Items 1 to 3, wherein the first light has the maximum intensity in a first direction determined in advance by the submicron structure.

[Item 5] The light-emitting device according to Item 4, wherein the first direction is normal to the photoluminescent layer.

[Item 6] The light-emitting device according to Item 4 or 5, wherein the first light emitted in the first direction is linearly polarized light.

[Item 7] The light-emitting device according to any one of Items 4 to 6, wherein the directional angle of the first light with respect to the first direction is less than 15 degrees.

[Item 8] The light-emitting device according to any one of Items 4 to 7, wherein second light having a wavelength $\lambda_b$ different from the wavelength $\lambda_a$ of the first light has the maximum intensity in a second direction different from the first direction.

[Item 9] The light-emitting device according to any one of Items 1 to 8, wherein the light-transmissive layer has the submicron structure.

[Item 10] The light-emitting device according to any one of Items 1 to 9, wherein the photoluminescent layer has the submicron structure.

[Item 11] The light-emitting device according to any one of Items 1 to 8, wherein the photoluminescent layer has a flat main surface, and the light-transmissive layer is located on the flat main surface of the photoluminescent layer and has the submicron structure.

[Item 12] The light-emitting device according to Item 11, wherein the photoluminescent layer is supported by a transparent substrate.

[Item 13] The light-emitting device according to any one of Items 1 to 8, wherein the light-transmissive layer is a transparent substrate having the submicron structure on a main surface thereof, and the photoluminescent layer is located on the submicron structure.

[Item 14] The light-emitting device according to Item 1 or 2, wherein the refractive index $n_{t-a}$ of the light-transmissive layer for the first light is higher than or equal to the refractive index $n_{wav-s}$ of the photoluminescent layer for the first light, and each of the projections or recesses in the submicron structure has a height or depth of 150 nm or less.

[Item 15] The light-emitting device according to any one of Items 1 and 3 to 14, wherein the submicron structure includes at least one periodic structure having at least the projections or recesses, and the at least one periodic structure includes a first periodic structure having a period $p_a$ that satisfies $\lambda_a/n_{wav-a} < p_a < \lambda_a$, and the first periodic structure is a one-dimensional periodic structure.

[Item 16] The light-emitting device according to Item 15, wherein light emitted from the photoluminescent layer includes second light having a wavelength $\lambda_b$ different from the wavelength $\lambda_a$ in air, the at least one periodic structure further includes a second periodic structure having a period $p_b$ that satisfies $\lambda_b/n_{wav-b} < p_b < \lambda_b$, wherein $n_{wav-b}$ denotes a refractive index of the photoluminescent layer for the second light, and the second periodic structure is a one-dimensional periodic structure.

[Item 17] The light-emitting device according to any one of Items 1 and 3 to 14, wherein the submicron structure includes at least two periodic structures having at least the projections or recesses, and the at least two periodic structures include a two-dimensional periodic structure having periodicity in different directions.

[Item 18] The light-emitting device according to any one of Items 1 and 3 to 14, wherein the submicron structure includes periodic structures having at least the projections or recesses, and the periodic structures include periodic structures arranged in a matrix.

[Item 19] The light-emitting device according to any one of Items 1 and 3 to 14, wherein the submicron structure includes periodic structures having at least the projections or recesses, and the periodic structures include a periodic structure having a period $p_{ex}$ that satisfies $\lambda_{ex}/n_{wav-ex} < p_{ex} < \lambda_{ex}$, wherein $\lambda_{ex}$ denotes the wavelength of excitation light in air for a photoluminescent material contained in the photoluminescent layer, and $n_{wav-ex}$ denotes the refractive index of the photoluminescent layer for the excitation light.

[Item 20] A light-emitting device including photoluminescent layers and light-transmissive layers, wherein at least two of the photoluminescent layers are independently the photoluminescent layer according to any one of Items 1 to 19, and at least two of the light-transmissive layers are independently the light-transmissive layer according to any one of Items 1 to 19.

[Item 21] The light-emitting device according to Item 20, wherein the photoluminescent layers and the light-transmissive layers are stacked on top of each other.

[Item 22] A light-emitting device including a photoluminescent layer, a light-transmissive layer located on or near the photoluminescent layer, and a submicron structure that is formed on at least one of the photoluminescent layer and the light-transmissive layer and that extends in a plane of the photoluminescent layer or the light-transmissive layer, wherein light for forming a quasi-guided mode in the photoluminescent layer and the light-transmissive layer is emitted.

[Item 23] A light-emitting device including a waveguide layer capable of guiding light, and a periodic structure located on or near the waveguide layer, wherein the waveguide layer contains a photoluminescent material, and the waveguide layer includes a quasi-guided mode in which light emitted from the photoluminescent material is guided while interacting with the periodic structure.

[Item 24] A light-emitting device including a photoluminescent layer, a light-transmissive layer located on or near the photoluminescent layer, and a submicron structure that is formed on at least one of the photoluminescent layer and the light-transmissive layer and that extends in a plane of the photoluminescent layer or the light-transmissive layer, wherein the submicron structure has projections or recesses, and the distance $D_{int}$ between adjacent projections or recesses, the wavelength $\lambda_{ex}$ of excitation light in air for a photoluminescent material contained in the photoluminescent layer, and the refractive index $n_{wav-ex}$ of a medium having the highest refractive index for the excitation light out of media present in an optical path to the photoluminescent layer or the light-transmissive layer satisfy $\lambda_{ex}/n_{wav-ex} < D_{int} < \lambda_{ex}$.

[Item 25] The light-emitting device according to Item 24, wherein the submicron structure includes at least one periodic structure having at least the projections or recesses, and the at least one periodic structure includes a first periodic structure having a period $p_{ax}$ that satisfies $\lambda_{ex}/n_{wav-ex} < p_{ex} < \lambda_{ex}$.

[Item 26] A light-emitting device including a light-transmissive layer, a submicron structure that is formed in the light-transmissive layer and extends in a plane of the light-transmissive layer, and a photoluminescent layer located on or near the submicron structure, wherein the submicron structure has projections or recesses, light emitted from the photoluminescent layer includes first light having a wavelength $\lambda_a$ in air, the submicron structure includes at least one periodic structure having at least the projections or recesses, and the refractive index $n_{wav-a}$ of the photoluminescent layer for the first light and the period $p_a$ of the at least one periodic structure satisfy $\lambda_a/n_{wav-a} < p_a < \lambda_a$.

[Item 27] A light-emitting device including a photoluminescent layer, a light-transmissive layer having a higher refractive index than the photoluminescent layer, and a submicron structure that is formed in the light-transmissive layer and extends in a plane of the light-transmissive layer, wherein the submicron structure has projections or recesses, light emitted from the photoluminescent layer includes first light having a wavelength $\lambda_a$ in air, the submicron structure includes at least one periodic structure having at least the projections or recesses, and the refractive index $n_{wav-a}$ of the photoluminescent layer for the first light and the period $p_a$ of the at least one periodic structure satisfy $\lambda_a/n_{wav-a} < p_a < \lambda_a$.

[Item 28] A light-emitting device including a photoluminescent layer, and a submicron structure that is formed in the photoluminescent layer and extends in a plane of the photoluminescent layer, wherein the submicron structure has projections or recesses, light emitted from the photoluminescent layer includes first light having a wavelength $\lambda_a$ in air, the submicron structure includes at least one periodic structure having at least the projections or recesses, and the refractive index $n_{wav-a}$ of the photoluminescent layer for the first light and the period $p_a$ of the at least one periodic structure satisfy $\lambda_a/n_{wav-a} < p_a < \lambda_a$.

[Item 29] The light-emitting device according to any one of Items 1 to 21 and 24 to 28, wherein the submicron structure has both the projections and the recesses.

[Item 30] The light-emitting device according to any one of Items 1 to 22 and 24 to 27, wherein the photoluminescent layer is in contact with the light-transmissive layer.

[Item 31] The light-emitting device according to Item 23, wherein the waveguide layer is in contact with the periodic structure.

[Item 32] A light-emitting apparatus including the light-emitting device according to any one of Items 1 to 31, and an excitation light source for irradiating the photoluminescent layer with excitation light.

[Item 33] A light-emitting device including:

a photoluminescent layer having a first surface perpendicular to a thickness direction thereof, an area of the first surface being larger than a sectional area of the photoluminescent layer perpendicular to the first surface;

a light-transmissive layer located on the photoluminescent layer, at least one of the photoluminescent layer and the light-transmissive layer having a submicron structure; and a multilayer mirror layered together with the photoluminescent layer and the light-transmissive layer, wherein the submicron structure has at least projections or recesses arranged perpendicular to the thickness direction of the photoluminescent layer, the photoluminescent layer emits light including first light having a wavelength $\lambda_a$ in air, at least one of the photoluminescent layer and the light-transmissive layer has a light emitting surface perpendicular to the thickness direction of the photoluminescent layer, the first light being emitted from the light emitting surface, a distance $D_{int}$ between adjacent projections or recesses and a refractive index $n_{wav-a}$ of the photoluminescent layer for the first light satisfy $\lambda_a/n_{wav-a} < D_{int} < \lambda_a$, and a thickness of the photoluminescent layer, the refractive index $n_{wav-a}$, and the distance $D_{int}$ are set to limit a directional angle of the first light emitted from the light emitting surface.

[Item 34] The light-emitting device according to Item 33, wherein the multilayer mirror includes low-refractive-index layers and high-refractive-index layers having a higher refractive index than the low-refractive-index layers, and the low-refractive-index layers and the high-refractive-index layers are alternately stacked on top of one another.

[Item 35] The light-emitting device according to Item 34, wherein the refractive indices $n_L$ and $n_H$ of the low-refractive-index layers and the high-refractive-index layers, respectively, and the thicknesses $t_{ML}$ and $t_{MH}$ of the low-refractive-index layers and the high-refractive-index layers, respectively, satisfy the following formulae:

$$(2m_R - 1.2)\lambda_a/(4n_L) \le t_{ML} \le (2m_R - 0.8)\lambda_a/(4n_L), \text{ and}$$

$$(2m_R - 1.2)\lambda_a/(4n_H) \le t_{MH} \le (2m_R - 0.8)\lambda_a/(4n_H),$$

wherein $m_R$ is a positive integer.

[Item 36] The light-emitting device according to any one of Items 33 to 35, wherein the high-refractive-index layers are formed of a material same as that of the photoluminescent layer.

[Item 37] The light-emitting device according to Item 35, wherein $m_R$ is 1.

[Item 38] The light-emitting device according to any one of Items 33 to 37, wherein
the light-transmissive layer has the submicron structure, and
the photoluminescent layer is located between the light-transmissive layer and the multilayer mirror.

[Item 39] The light-emitting device according to any one of Items 33 to 37, further including an adjusting layer between the multilayer mirror and the photoluminescent layer.

[Item 40] The light-emitting device according to any one of Items 33 to 37, further including
a transparent substrate for supporting the photoluminescent layer, and
an adjusting layer,
wherein the first surface of the photoluminescent layer is a flat main surface,
the light-transmissive layer is located on the flat main surface of the photoluminescent layer and has the submicron structure,
the adjusting layer is located on the photoluminescent layer and covers the light-transmissive layer, and
the multilayer mirror is located on the adjusting layer.

[Item 41] The light-emitting device according to any one of Items 33 to 39, wherein
the light-transmissive layer is a transparent substrate having the submicron structure on a surface thereof,
the photoluminescent layer is located on a surface of the transparent substrate so as to cover the submicron structure, and
the multilayer mirror is located on the photoluminescent layer.

[Item 42] The light-emitting device according to Item 41, wherein the first surface of the photoluminescent layer is a flat main surface opposite the transparent substrate.

[Item 43] The light-emitting device according to Item 41, wherein
the first surface of the photoluminescent layer is a textured main surface opposite the transparent substrate, the textured main surface mating with the projections or recesses of the submicron structure, and
the multilayer mirror has a texture mating with the projections or recesses of the submicron structure.

[Item 44] The light-emitting device according to any one of Items 33 to 43, including
a light-transmissive structure including the photoluminescent layer and the light-transmissive layer,
wherein the multilayer mirror is in contact with the light-transmissive structure, and the light-transmissive structure has a higher refractive index than the multilayer mirror at the interface between the multilayer mirror and the light-transmissive structure, and
the light-transmissive structure has an effective optical path length $d_T$ in the stacking direction that satisfies the following formula:

$$(4m_T-1)\lambda_a/(8n_{wav-a}) < d_T < (4m_T+1)\lambda_a/(8n_{wav-a}),$$

wherein $m_T$ is a positive integer.

[Item 45] The light-emitting device according to any one of Items 33 to 43, including
a light-transmissive structure including the photoluminescent layer and the light-transmissive layer,
wherein the multilayer mirror is in contact with the light-transmissive structure, and the light-transmissive structure has a lower refractive index than the multilayer mirror at the interface between the multilayer mirror and the light-transmissive structure, and
the light-transmissive structure has an effective optical path length $d_T$ in the stacking direction that satisfies the following formula:

$$(4m_T-3)\lambda_a/(8n_{wav-a}) < d_T < (4m_T-1)\lambda_a/(8n_{wav-a}),$$

wherein $m_T$ is a positive integer.

[Item 46] The light-emitting device according to Item 44 or 45, wherein $m_T$ is 1.

[Item 47] A light-emitting device including:
a light-transmissive layer having a submicron structure;
a photoluminescent layer located on the submicron structure; and
a multilayer mirror layered together with the photoluminescent layer and the light-transmissive layer, wherein
the photoluminescent layer has a first surface perpendicular to a thickness direction thereof, an area of the first surface being larger than a sectional area of the photoluminescent layer perpendicular to the first surface,
the submicron structure includes at least one periodic structure having at least projections or recesses arranged perpendicular to the thickness direction of the photoluminescent layer,
the photoluminescent layer emits light including first light having a wavelength $\lambda_a$ in air,
at least one of the photoluminescent layer and the light-transmissive layer has a light emitting surface perpendicular to the thickness direction of the photoluminescent layer, the first light being emitted from the light emitting surface,
a refractive index $n_{wav-a}$ of the photoluminescent layer for the first light and a period $p_a$ of the at least one periodic structure satisfy $\lambda_a/n_{wav-a} < p_a < \lambda_a$, and a thickness of the photoluminescent layer, the refractive index $n_{wav-a}$, and the period $p_a$ are set to limit a directional angle of the first light emitted from the light emitting surface.

[Item 48] A light-emitting device including:
a photoluminescent layer having a first surface perpendicular to a thickness direction thereof, an area of the first surface being larger than a sectional area of the photoluminescent layer perpendicular to the first surface;
a light-transmissive layer having a higher refractive index than the photoluminescent layer; and
a multilayer mirror layered together with the photoluminescent layer and the light-transmissive layer, wherein
the light-transmissive layer has a submicron structure including at least one periodic structure comprising at least projections or recesses arranged perpendicular to the thickness direction of the photoluminescent layer,
the photoluminescent layer emits light including first light having a wavelength $\lambda_a$ in air,
at least one of the photoluminescent layer and the light-transmissive layer has a light emitting surface perpendicular to the thickness direction of the photoluminescent layer, the first light being emitted from the light emitting surface,
a refractive index $n_{wav-a}$ of the photoluminescent layer for the first light and a period $p_a$ of the at least one periodic structure satisfy $\lambda_a/n_{wav-a} < p_a < \lambda_a$, and a thickness of the photoluminescent layer, the refractive index $n_{wav-a}$, and the period $p_a$ are set to limit a directional angle of the first light emitted from the light emitting surface.

[Item 49] The light-emitting device according to any one of Items 33 to 47, wherein the photoluminescent layer is in contact with the light-transmissive layer.

[Item 50] A light-emitting device including:
a photoluminescent layer having a submicron structure; and
a multilayer mirror layered together with the photoluminescent layer, wherein
the photoluminescent layer has a first surface perpendicular to a thickness direction thereof, an area of the first surface being larger than a sectional area of the photoluminescent layer perpendicular to the first surface,
the submicron structure includes at least one periodic structure having at least projections or recesses arranged perpendicular to the thickness direction of the photoluminescent layer,
the photoluminescent layer emits light including first light having a wavelength $\lambda_a$ in air,
the photoluminescent layer has a light emitting surface perpendicular to the thickness direction of the photoluminescent layer, the first light being emitted from the light emitting surface,
a refractive index $n_{wav-a}$ of the photoluminescent layer for the first light and a period $p_a$ of the at least one periodic structure satisfy $\lambda_a/n_{wav-a} < p_a < \lambda_a$, and
a thickness of the photoluminescent layer, the refractive index $n_{wav-a}$, and the period $p_a$ are set to limit a directional angle of the first light emitted from the light emitting surface.

[Item 51] The light-emitting device according to any one of Items 33 to 50, wherein the submicron structure has both the projections and the recesses.

[Item 52] The light-emitting device according to any one of Items 33 to 51, wherein the photoluminescent layer includes a phosphor.

[Item 53] The light-emitting device according to any one of Items 33 to 52, wherein 380 nm $\leq \lambda_a \leq$ 780 nm is satisfied.

[Item 54] The light-emitting device according to any one of Items 33 to 53, wherein the thickness of the photoluminescent layer, the refractive index $n_{wav-a}$, and the distance $D_{int}$ are set to allow an electric field to be formed in the photoluminescent layer, in which antinodes of the electric field are located in areas, the areas each corresponding to respective one of the projections and/or recesses.

[Item 55] The light-emitting device according to Items 33 to 54, wherein the light-transmissive layer is located indirectly on the photoluminescent layer.

[Item 56] The light-emitting device according to Items 33 to 55, wherein the thickness of the photoluminescent layer, the refractive index $n_{wav-a}$, and the distance $D_{int}$ are set to allow an electric field to be formed in the photoluminescent layer, in which antinodes of the electric field are located at, or adjacent to, at least the projections or recesses.

[Item 57] A light-emitting apparatus including
the light-emitting device according to any one of Items 33 to 56, and
an excitation light source for irradiating the photoluminescent layer with excitation light.

A light-emitting device according to an embodiment of the present disclosure includes a photoluminescent layer, a light-transmissive layer located on or near the photoluminescent layer, and a submicron structure that is formed on at least one of the photoluminescent layer and the light-transmissive layer and that extends in a plane of the photoluminescent layer or the light-transmissive layer. The submicron structure has projections or recesses, light emitted from the photoluminescent layer includes first light having a wavelength $\lambda_a$ in air, and the distance $D_{int}$ between adjacent projections or recesses and the refractive index $n_{wav-a}$ of the photoluminescent layer for the first light satisfy $\lambda_a/n_{wav-a} < D_{int} < \lambda_a$. The wavelength $\lambda_a$ is, for example, within the visible wavelength range (for example, 380 to 780 nm).

The photoluminescent layer contains a photoluminescent material. The term "photoluminescent material" refers to a material that emits light in response to excitation light. The term "photoluminescent material" encompasses fluorescent materials and phosphorescent materials in a narrow sense, encompasses inorganic materials and organic materials (for example, dyes), and encompasses quantum dots (that is, tiny semiconductor particles). The photoluminescent layer may contain a matrix material (host material) in addition to the photoluminescent material. Examples of matrix materials include resins and inorganic materials such as glasses and oxides.

The light-transmissive layer located on or near the photoluminescent layer is made of a material with high transmittance to the light emitted from the photoluminescent layer, for example, inorganic materials or resins. For example, the light-transmissive layer is desirably formed of a dielectric material (particularly, an insulator having low light absorptivity). For example, the light-transmissive layer may be a substrate that supports the photoluminescent layer. If the surface of the photoluminescent layer facing air has the submicron structure, the air layer can serve as the light-transmissive layer.

In a light-emitting device according to an embodiment of the present disclosure, a submicron structure (for example, a periodic structure) on at least one of the photoluminescent layer and the light-transmissive layer forms a unique electric field distribution inside the photoluminescent layer and the light-transmissive layer, as described in detail later with reference to the results of calculations and experiments. This electric field distribution is formed by an interaction between guided light and the submicron structure and may also be referred to as a "quasi-guided mode".

The quasi-guided mode can be utilized to improve the luminous efficiency, directionality, and polarization selectivity of photoluminescence, as described later. The term "quasi-guided mode" may be used in the following description to describe novel structures and/or mechanisms contemplated by the inventors. However, such a description is for illustrative purposes only and is not intended to limit the present disclosure in any way.

For example, the submicron structure has projections, and the distance (the center-to-center distance) $D_{int}$ between adjacent projections satisfies $\lambda_a/n_{wav-a} < D_{int} < \lambda_a$. Instead of the projections, the submicron structure may have recesses. For simplicity, the following description will be directed to a submicron structure having projections. The symbol $\lambda$ denotes the wavelength of light, and the symbol $\lambda_a$ denotes the wavelength of light in air. The symbol $n_{wav}$ denotes the refractive index of the photoluminescent layer. If the photoluminescent layer is a medium containing materials, the refractive index $n_{wav}$ denotes the average refractive index of the materials weighted by their respective volume fractions.

Although it is desirable to use the symbol $n_{wav-a}$ to refer to the refractive index for light having a wavelength $\lambda_a$ because the refractive index n generally depends on the wavelength, it may be abbreviated for simplicity. The symbol $n_{wav}$ basically denotes the refractive index of the photoluminescent layer; however, if a layer having a higher refractive index than the photoluminescent layer is adjacent to the photoluminescent layer, the refractive index $n_{wav}$ denotes the average refractive index of the layer having a higher refractive index and the photoluminescent layer weighted by their respective volume fractions. This is optically equivalent to a photoluminescent layer composed of layers of different materials.

The effective refractive index $n_{eff}$ of the medium for light in the quasi-guided mode satisfies $n_a < n_{eff} < n_{wav}$, wherein $n_a$ denotes the refractive index of air. If light in the quasi-guided mode is assumed to be light propagating through the photoluminescent layer while being totally reflected at an angle of incidence θ, the effective refractive index $n_{eff}$ can be written as $n_{eff} = n_{wav} \sin θ$. The effective refractive index $n_{eff}$ is determined by the refractive index of the medium present in the region where the electric field of the quasi-guided mode is distributed.

For example, if the submicron structure is formed in the light-transmissive layer, the effective refractive index $n_{eff}$ depends not only on the refractive index of the photoluminescent layer but also on the refractive index of the light-transmissive layer. Because the electric field distribution also varies depending on the polarization direction of the quasi-guided mode (that is, the TE mode or the TM mode), the effective refractive index $n_{eff}$ can differ between the TE mode and the TM mode.

The submicron structure is formed on at least one of the photoluminescent layer and the light-transmissive layer. If the photoluminescent layer and the light-transmissive layer are in contact with each other, the submicron structure may be formed on the interface between the photoluminescent layer and the light-transmissive layer. In such a case, the photoluminescent layer and the light-transmissive layer have the submicron structure. The photoluminescent layer may have no submicron structure. In such a case, a light-transmissive layer having a submicron structure is located on or near the photoluminescent layer. A phrase like "a light-transmissive layer (or its submicron structure) located on or near the photoluminescent layer", as used herein, typically means that the distance between these layers is less than half the wavelength $\lambda_a$. This allows the electric field of a guided mode to reach the submicron structure, thus forming a quasi-guided mode. However, the distance between the submicron structure of the light-transmissive layer and the photoluminescent layer may exceed half the wavelength $\lambda_a$ if the light-transmissive layer has a higher refractive index than the photoluminescent layer. If the light-transmissive layer has a higher refractive index than the photoluminescent layer, light reaches the light-transmissive layer even if the above relationship is not satisfied. In the present specification, if the photoluminescent layer and the light-transmissive layer have a positional relationship that allows the electric field of a guided mode to reach the submicron structure and form a quasi-guided mode, they may be associated with each other.

The submicron structure, which satisfies $\lambda_a/n_{wav-a} < D_{int} < \lambda_a$, as described above, is characterized by a submicron size. The submicron structure includes at least one periodic structure, as in the light-emitting devices according to the embodiments described in detail later. The at least one periodic structure has a period $p_a$ that satisfies $\lambda_a/n_{wav-a} < p_a < \lambda_a$. Thus, the submicron structure includes a periodic structure in which the distance $D_{int}$ between adjacent projections is constant at $p_a$. If the submicron structure includes a periodic structure, light in the quasi-guided mode propagates while repeatedly interacting with the periodic structure so that the light is diffracted by the submicron structure. Unlike the phenomenon in which light propagating through free space is diffracted by a periodic structure, this is the phenomenon in which light is guided (that is, repeatedly totally reflected) while interacting with the periodic structure. This can efficiently diffract light even if the periodic structure causes a small phase shift (that is, even if the periodic structure has a small height).

The above mechanism can be utilized to improve the luminous efficiency of photoluminescence by the enhancement of the electric field due to the quasi-guided mode and also to couple the emitted light into the quasi-guided mode. The angle of travel of the light in the quasi-guided mode is varied by the angle of diffraction determined by the periodic structure. This can be utilized to output light of a particular wavelength in a particular direction (that is, significantly improve the directionality). Furthermore, high polarization selectivity can be simultaneously achieved because the effective refractive index $n_{eff}$ ($=n_{wav} \sin θ$) differs between the TE mode and the TM mode. For example, as demonstrated by the experimental examples below, a light-emitting device can be provided that outputs intense linearly polarized light (for example, the TM mode) of a particular wavelength (for example, 610 nm) in the front direction. The directional angle of the light output in the front direction is, for example, less than 15 degrees. The term "directional angle" refers to the angle of one side with respect to the front direction, which is assumed to be 0 degrees.

Conversely, a submicron structure having a lower periodicity results in a lower directionality, luminous efficiency, polarization, and wavelength selectivity. The periodicity of the submicron structure may be adjusted depending on the need. The periodic structure may be a one-dimensional periodic structure, which has a higher polarization selectivity, or a two-dimensional periodic structure, which allows for a lower polarization.

The submicron structure may include periodic structures. For example, these periodic structures may have different periods or different periodic directions (axes). The periodic structures may be formed on the same plane or may be stacked on top of each other. The light-emitting device may include photoluminescent layers and light-transmissive layers, and each of the layers may have submicron structures.

The submicron structure can be used not only to control the light emitted from the photoluminescent layer but also to efficiently guide excitation light into the photoluminescent layer. That is, the excitation light can be diffracted and coupled into the quasi-guided mode to guide light in the photoluminescent layer and the light-transmissive layer by the submicron structure to efficiently excite the photoluminescent layer. A submicron structure may be used that satisfies $\lambda_{ex}/n_{wav-ex} < D_{int} < \lambda_{ex}$, wherein ex denotes the wavelength in air of the light that excites the photoluminescent material, and $n_{wav-ex}$ denotes the refractive index of the photoluminescent layer for the excitation light. The symbol $n_{wav-ex}$ denotes the refractive index of the photoluminescent layer for the emission wavelength of the photoluminescent material. Alternatively, a submicron structure may be used that includes a periodic structure having a period $p_{ex}$ that satisfies $\lambda_{ex}/n_{wav-ex} < p_{ex} < \lambda_{ex}$. The excitation light has a wavelength $\lambda_{ex}$ of 450 nm, for example, but may have a shorter wavelength than visible light. If the excitation light has a wavelength within the visible range, it may be output together with the light emitted from the photoluminescent layer.

1. Underlying Knowledge Forming Basis of the Present Disclosure

The underlying knowledge forming the basis for the present disclosure will be described before describing specific embodiments of the present disclosure. As described above, photoluminescent materials such as those used for fluorescent lamps and white LEDs emit light in all directions and thus require optical elements such as reflectors and lenses to emit light in a particular direction. These optical elements, however, can be eliminated (or the size thereof can be reduced) if the photoluminescent layer itself emits directional light. This results in a significant reduction in the size of optical devices and equipment. With this idea in mind, the inventors have conducted a detailed study on the photoluminescent layer to achieve directional light emission.

The inventors have investigated the possibility of inducing light emission with particular directionality so that the light emitted from the photoluminescent layer is localized in a particular direction. Based on Fermi's golden rule, the emission rate Γ, which is a measure characterizing light emission, is represented by the equation (1):

$$\Gamma(r) = \frac{2\pi}{\hbar} \langle (d \cdot E(r)) \rangle^2 \rho(\lambda) \quad (1)$$

In the equation (1), r is the vector indicating the position, λ is the wavelength of light, d is the dipole vector, E is the electric field vector, and ρ is the density of states. For many substances other than some crystalline substances, the dipole vector d is randomly oriented. The magnitude of the electric field E is substantially constant irrespective of the direction if the size and thickness of the photoluminescent layer are sufficiently larger than the wavelength of light. Hence, in most cases, the value of $\langle (d \cdot E(r)) \rangle^2$ does not depend on the direction. Accordingly, the emission rate Γ is constant irrespective of the direction. Thus, in most cases, the photoluminescent layer emits light in all directions.

As can be seen from the equation (1), to achieve anisotropic light emission, it is necessary to align the dipole vector d in a particular direction or to enhance the component of the electric field vector in a particular direction. One of these approaches can be employed to achieve directional light emission. In the present disclosure, the results of a detailed study and analysis on structures for utilizing a quasi-guided mode in which the electric field component in a particular direction is enhanced by the confinement of light in the photoluminescent layer will be described below.

2. Structure for Enhancing Electric Field Only in Particular Direction

The inventors have investigated the possibility of controlling light emission using a guided mode with an intense electric field. Light can be coupled into a guided mode using a waveguide structure that itself contains a photoluminescent material. However, a waveguide structure simply formed using a photoluminescent material outputs little or no light in the front direction because the emitted light is coupled into a guided mode. Accordingly, the inventors have investigated the possibility of combining a waveguide containing a photoluminescent material with a periodic structure (including projections or recesses or both). When the electric field of light is guided in a waveguide while overlapping with a periodic structure located on or near the waveguide, a quasi-guided mode is formed by the effect of the periodic structure. That is, the quasi-guided mode is a guided mode restricted by the periodic structure and is characterized in that the antinodes of the amplitude of the electric field have the same period as the periodic structure. Light in this mode is confined in the waveguide structure to enhance the electric field in a particular direction. This mode also interacts with the periodic structure to undergo diffraction so that the light in this mode is converted into light propagating in a particular direction and can thus be output from the waveguide. The electric field of light other than the quasi-guided mode is not enhanced because little or no such light is confined in the waveguide. Thus, most light is coupled into a quasi-guided mode with a large electric field component.

That is, the inventors have investigated the possibility of using a photoluminescent layer containing a photoluminescent material as a waveguide (or a waveguide layer including a photoluminescent layer) in combination with a periodic structure located on or near the waveguide to couple light into a quasi-guided mode in which the light is converted into light propagating in a particular direction, thereby providing a directional light source.

Figure 30:
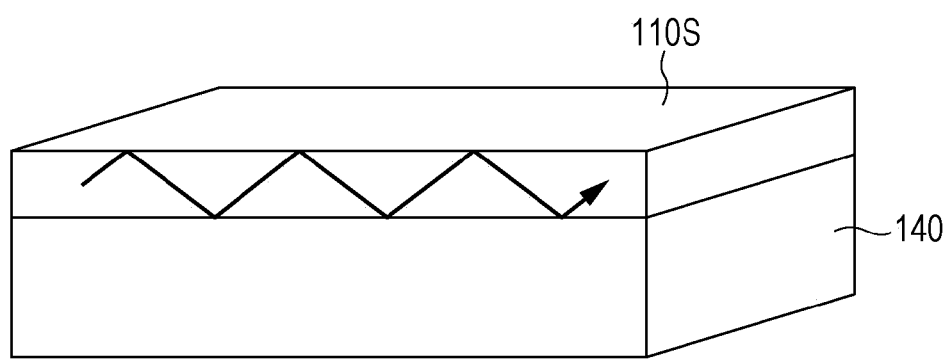
FIG. 30 is a schematic perspective view of a slab waveguide.

As a simple waveguide structure, the inventors have studied slab waveguides. A slab waveguide has a planar structure in which light is guided. FIG. 30 is a schematic perspective view of a slab waveguide 110S. There is a mode of light propagating through the waveguide 110S if the waveguide 110S has a higher refractive index than a transparent substrate 140 that supports the waveguide 110S. If such a slab waveguide includes a photoluminescent layer, the electric field of light emitted from an emission point overlaps largely with the electric field of a guided mode. This allows most of the light emitted from the photoluminescent layer to be coupled into the guided mode. If the photoluminescent layer has a thickness close to the wavelength of the light, a situation can be created where there is only a guided mode with a large electric field amplitude.

If a periodic structure is located on or near the photoluminescent layer, the electric field of the guided mode interacts with the periodic structure to form a quasi-guided mode. Even if the photoluminescent layer is composed of a plurality of layers, a quasi-guided mode is formed as long as the electric field of the guided mode reaches the periodic structure. Not all parts of the photoluminescent layer needs to be formed of a photoluminescent material, provided that at least a portion of the photoluminescent layer functions to emit light.

If the periodic structure is made of a metal, a mode due to the guided mode and plasmon resonance is formed. This mode has different properties from the quasi-guided mode. This mode is less effective in enhancing emission because a large loss occurs due to high absorption by the metal. Thus, it is desirable to form the periodic structure using a dielectric material having low absorptivity.

Figure 1B:
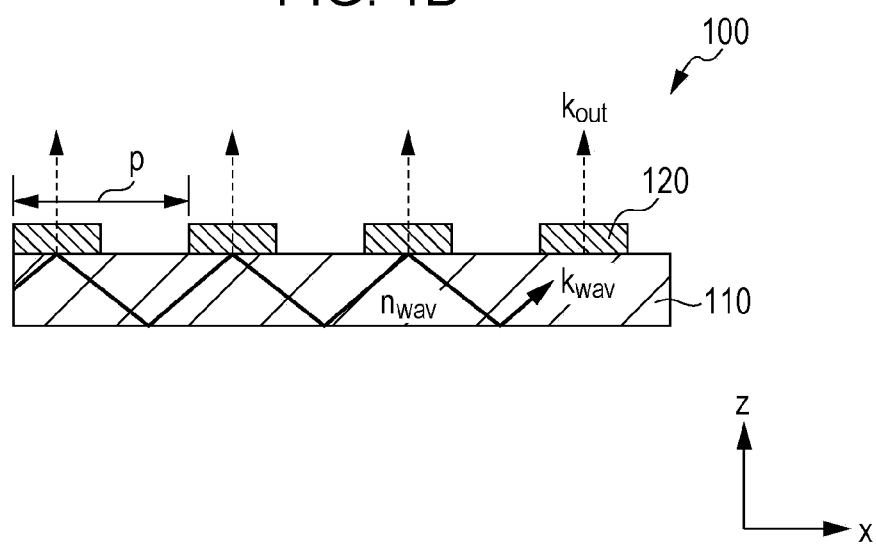
FIG. 1B is a fragmentary cross-sectional view of the light-emitting device illustrated in FIG. 1A.

The inventors have studied the coupling of light into a quasi-guided mode that can be output as light propagating in a particular angular direction using a periodic structure formed on a waveguide (for example, a photoluminescent layer). FIG. 1A is a schematic perspective view of a light-emitting device 100 including a waveguide (for example, a photoluminescent layer) 110 and a periodic structure (for example, a light-transmissive layer) 120. The light-transmissive layer 120 is hereinafter also referred to as a periodic structure 120 if the light-transmissive layer 120 forms a periodic structure (that is, if a periodic submicron structure is formed on the light-transmissive layer 120). In this example, the periodic structure 120 is a one-dimensional periodic structure in which stripe-shaped projections extending in the y direction are arranged at regular intervals in the x direction. FIG. 1B is a cross-sectional view of the light-emitting device 100 taken along a plane parallel to the xz plane. If a periodic structure 120 having a period p is provided in contact with the waveguide 110, a quasi-guided mode having a wave number $k_{wav}$ in the in-plane direction is converted into light propagating outside the waveguide 110. The wave number $k_{out}$ of the light can be represented by the equation (2):

$$k_{out} = k_{wav} - m\frac{2\pi}{p} \quad (2)$$

wherein m is an integer indicating the diffraction order.

For simplicity, the light guided in the waveguide 110 is assumed to be a ray of light propagating at an angle $\theta_{wav}$. This approximation gives the equations (3) and (4):

$$\frac{k_{wav}\lambda_0}{2\pi} = n_{wav}\sin\theta_{wav} \quad (3)$$

$$\frac{k_{out}\lambda_0}{2\pi} = n_{out}\sin\theta_{out} \quad (4)$$

In these equations, $\lambda_0$ denotes the wavelength of the light in air, $n_{wav}$ denotes the refractive index of the waveguide 110, $n_{out}$ denotes the refractive index of the medium on the light output side, and $\theta_{out}$ denotes the angle at which the light is output from the waveguide 110 to a substrate or air. From the equations (2) to (4), the output angle $\theta_{out}$ can be represented by the equation (5):

$$n_{out}\sin\theta_{out} = n_{wav}\sin\theta_{wav} - m\lambda_0/p \quad (5)$$

If $n_{wav}\sin\theta_{wav} = m\lambda_0/p$ in the equation (5), this results in $\theta_{out} = 0$, meaning that the light can be emitted in the direction perpendicular to the plane of the waveguide 110 (that is, in the front direction).

Based on this principle, light can be coupled into a particular quasi-guided mode and be converted into light having a particular output angle using the periodic structure to output intense light in that direction.

There are some constraints to achieving the above situation. To form a quasi-guided mode, the light propagating through the waveguide 110 has to be totally reflected. The conditions therefor are represented by the inequality (6):

$$n_{out} < n_{wav}\sin\theta_{wav} \quad (6)$$

To diffract the quasi-guided mode using the periodic structure and thereby output the light from the waveguide 110, $-1 < \sin\theta_{out} < 1$ has to be satisfied in the equation (5). Hence, the inequality (7) has to be satisfied:

$$-1 < \frac{n_{wav}}{n_{out}}\sin\theta_{wav} - \frac{m\lambda_0}{n_{out}p} < 1 \quad (7)$$

Taking into account the inequality (6), the inequality (8) may be satisfied:

$$\frac{m\lambda_0}{2n_{out}} < p \quad (8)$$

To output the light from the waveguide 110 in the front direction ($\theta_{out} = 0$), as can be seen from the equation (5), the equation (9) has to be satisfied:

$$p = m\lambda_0/(n_{wav}\sin\theta_{wav}) \quad (9)$$

As can be seen from the equation (9) and the inequality (6), the required conditions are represented by the inequality (10):

$$\frac{m\lambda_0}{n_{wav}} < p < \frac{m\lambda_0}{n_{out}} \quad (10)$$

If the periodic structure 120 as illustrated in FIGS. 1A and 1B is provided, it may be designed based on first-order diffracted light (that is, m=1) because higher-order diffracted light having m of 2 or more has low diffraction efficiency. In this embodiment, the period p of the periodic structure 120 is determined so as to satisfy the inequality (11), which is given by substituting m=1 into the inequality (10):

$$\frac{\lambda_0}{n_{wav}} < p < \frac{\lambda_0}{n_{out}} \quad (11)$$

If the waveguide (photoluminescent layer) 110 is not in contact with a transparent substrate, as illustrated in FIGS. 1A and 1B, $n_{out}$ is equal to the refractive index of air (approximately 1.0). Thus, the period p may be determined so as to satisfy the inequality (12):

$$\frac{\lambda_0}{n_{wav}} < p < \lambda_0 \quad (12)$$

Figure 1C:
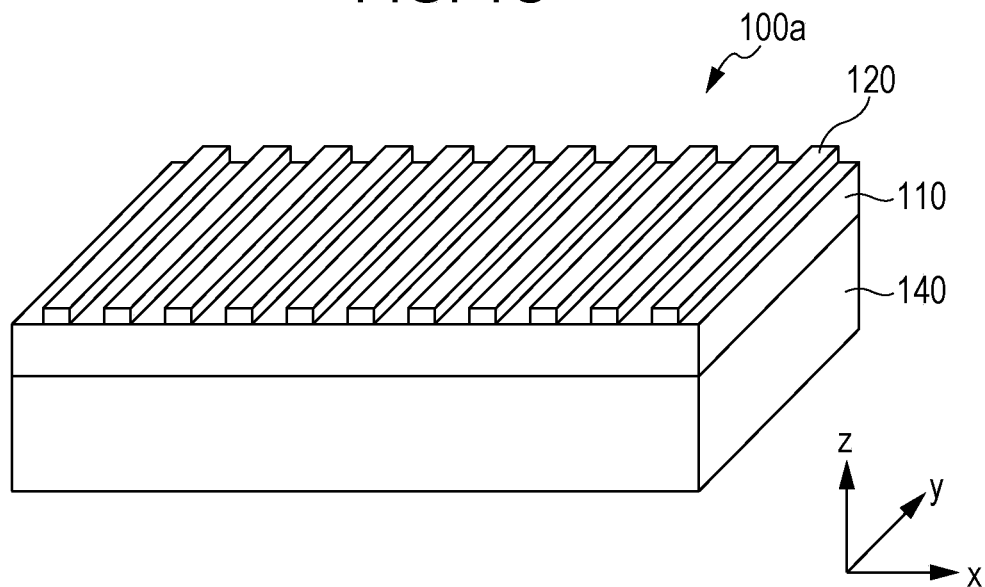
FIG. 1C is a perspective view of the structure of a light-emitting device according to another embodiment.
Figure 1D:
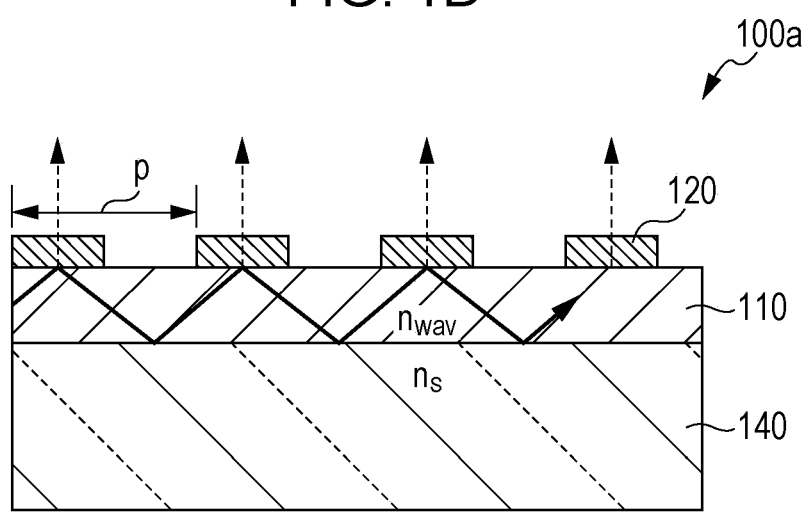
FIG. 1D is a fragmentary cross-sectional view of the light-emitting device illustrated in FIG. 1C.

Alternatively, a structure as illustrated in FIGS. 1C and 1D may be employed in which the photoluminescent layer 110 and the periodic structure 120 are formed on a transparent substrate 140. The refractive index $n_s$ of the transparent substrate 140 is higher than the refractive index of air. Thus, the period p may be determined so as to satisfy the inequality (13), which is given by substituting $n_{out} = n_s$ into the inequality (11):

$$\frac{\lambda_0}{n_{wav}} < p < \frac{\lambda_0}{n_s} \quad (13)$$

Although m=1 is assumed in the inequality (10) to give the inequalities (12) and (13), m≥2 may be assumed. That is, if both surfaces of the light-emitting device 100 are in contact with air layers, as shown in FIGS. 1A and 1B, the period p may be determined so as to satisfy the inequality (14):

$$\frac{m\lambda_0}{n_{wav}} < p < m\lambda_0 \quad (14)$$

wherein m is an integer of 1 or more.

Similarly, if the photoluminescent layer 110 is formed on the transparent substrate 140, as in the light-emitting device 100a illustrated in FIGS. 1C and 1D, the period p may be determined so as to satisfy the inequality (15):

$$\frac{m\lambda_0}{n_{wav}} < p < \frac{m\lambda_0}{n_s} \quad (15)$$

By determining the period p of the periodic structure so as to satisfy the above inequalities, the light emitted from the photoluminescent layer 110 can be output in the front direction, thus providing a directional light-emitting device.

3. Verification by Calculations

3-1. Period and Wavelength Dependence

The inventors verified, by optical analysis, whether the output of light in a particular direction as described above is actually possible. The optical analysis was performed by calculations using DiffractMOD available from Cybernet Systems Co., Ltd. In these calculations, the change in the absorption of external light incident perpendicular to a light-emitting device by a photoluminescent layer was calculated to determine the enhancement of light output perpendicular to the light-emitting device. The calculation of the process by which external incident light is coupled into a quasi-guided mode and is absorbed by the photoluminescent layer corresponds to the calculation of a process opposite to the process by which light emitted from the photoluminescent layer is coupled into a quasi-guided mode and is converted into propagating light output perpendicular to the light-emitting device. Similarly, the electric field distribution of a quasi-guided mode was calculated from the electric field of external incident light.

Figure 2:
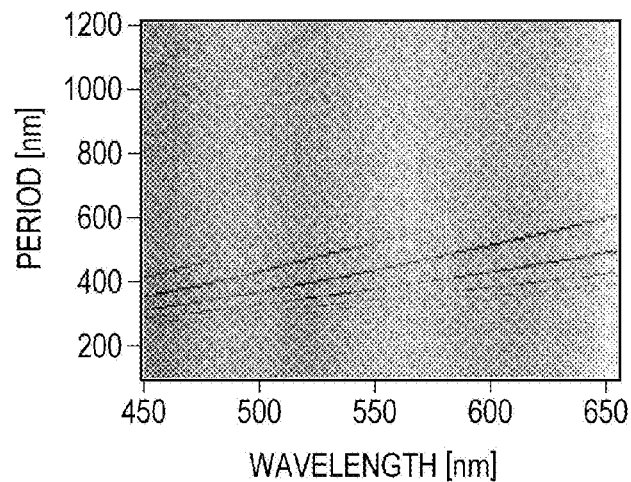
FIG. 2 is a graph showing the calculation results of the enhancement of light output in the front direction with varying emission wavelengths and varying a period of a periodic structure.

FIG. 2 shows the calculation results of the enhancement of light output in the front direction with varying emission wavelengths and varying periods of the periodic structure, where the photoluminescent layer was assumed to have a thickness of 1 μm and a refractive index $n_{wav}$ of 1.8, and the periodic structure was assumed to have a height of 50 nm and a refractive index of 1.5. In these calculations, the periodic structure was assumed to be a one-dimensional periodic structure uniform in the y direction, as shown in FIG. 1A, and the polarization of the light was assumed to be the TM mode, which has an electric field component parallel to the y direction. The results in FIG. 2 show that there are enhancement peaks at certain combinations of wavelength and period. In FIG. 2, the magnitude of the enhancement is expressed by different shades of color; a darker color (black) indicates a higher enhancement, whereas a lighter color (white) indicates a lower enhancement.

Figure 3:
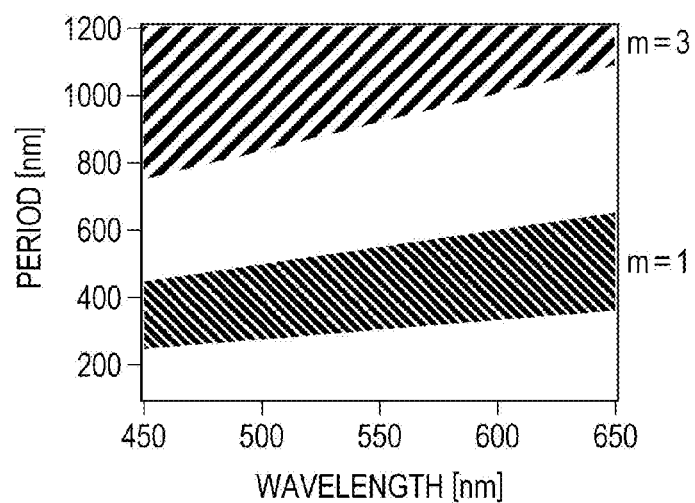
FIG. 3 is a graph illustrating the conditions for m=1 and m=3 in the inequality (10)

In the above calculations, the periodic structure was assumed to have a rectangular cross section as shown in FIG. 1B. FIG. 3 is a graph illustrating the conditions for m=1 and m=3 in the inequality (10). A comparison between FIGS. 2 and 3 shows that the peaks in FIG. 2 are located within the regions corresponding to m=1 and m=3. The intensity is higher for m=1 because first-order diffracted light has a higher diffraction efficiency than third- or higher-order diffracted light. There is no peak for m=2 because of low diffraction efficiency in the periodic structure.

In FIG. 2, a plurality of lines are observed in each of the regions corresponding to m=1 and m=3 in FIG. 3. This indicates the presence of a plurality of quasi-guided modes.

3-2. Thickness Dependence

Figure 4:
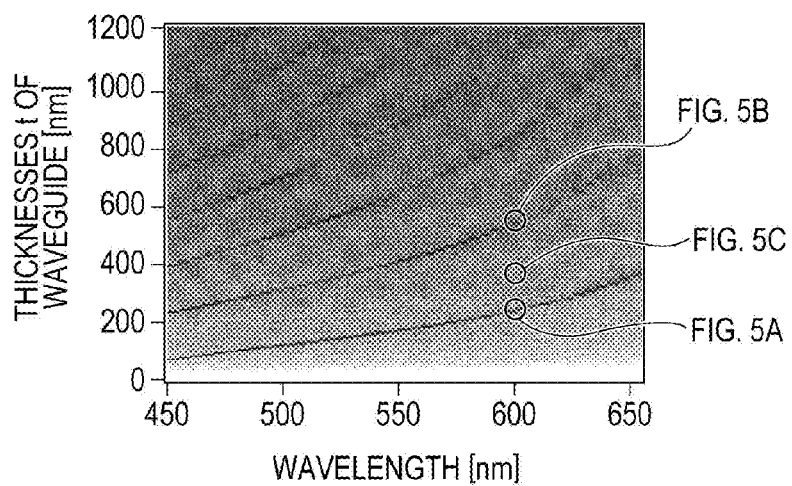
FIG. 4 is a graph showing the calculation results of the enhancement of light output in the front direction with varying emission wavelengths and varying thicknesses t of a photoluminescent layer.

FIG. 4 is a graph showing the calculation results of the enhancement of light output in the front direction with varying emission wavelengths and varying thicknesses t of the photoluminescent layer, where the photoluminescent layer was assumed to have a refractive index $n_{wav}$ of 1.8, and the periodic structure was assumed to have a period of 400 nm, a height of 50 nm, and a refractive index of 1.5. FIG. 4 shows that the enhancement of the light peaks at a particular thickness t of the photoluminescent layer.

Figure 5A:
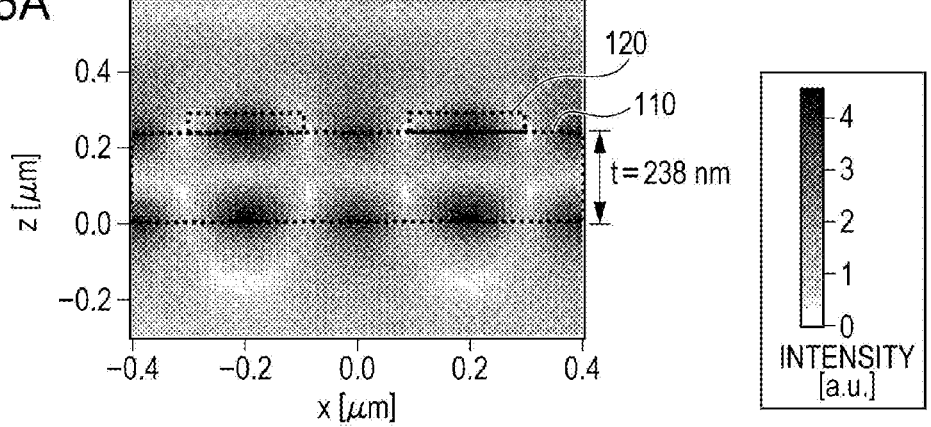
FIG. 5A is a graph showing the calculation results of the electric field distribution of a mode to guide light in the x direction for a thickness t of 238 nm.
Figure 5B:
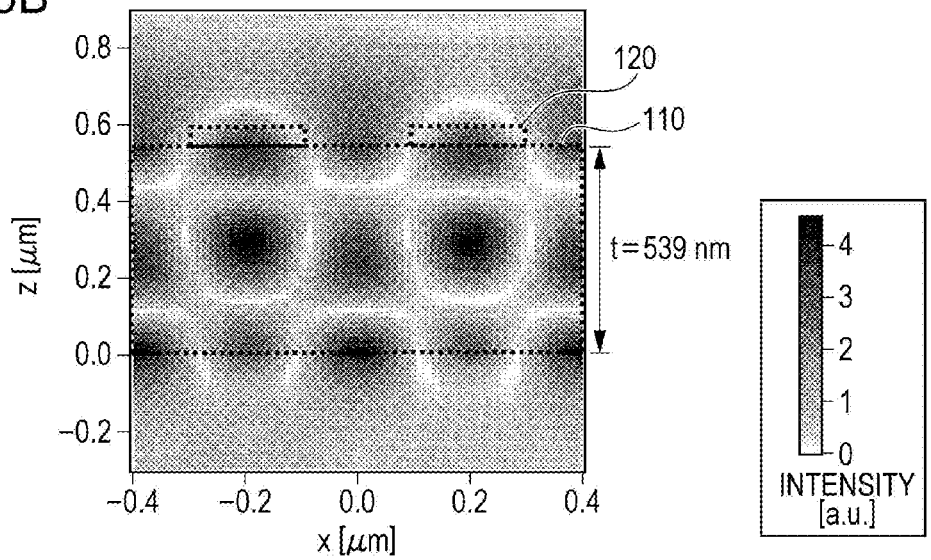
FIG. 5B is a graph showing the calculation results of the electric field distribution of a mode to guide light in the x direction for a thickness t of 539 nm.
Figure 5C:
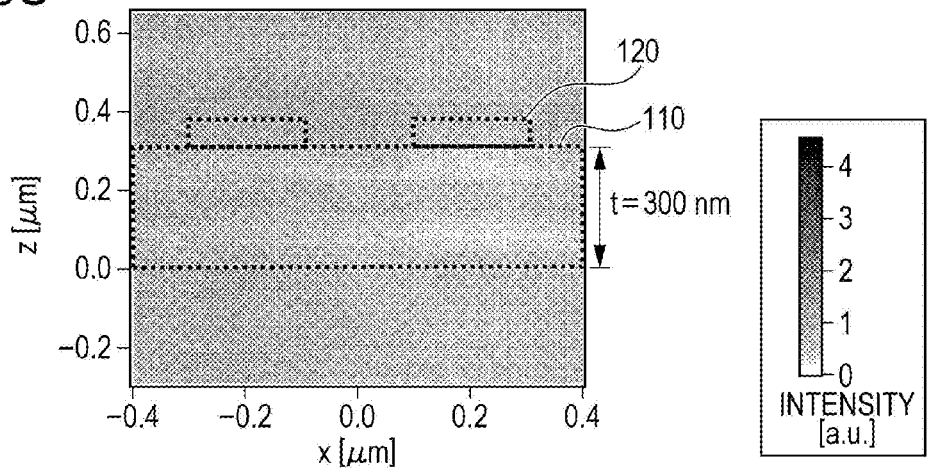
FIG. 5C is a graph showing the calculation results of the electric field distribution of a mode to guide light in the x direction for a thickness t of 300 nm.

FIGS. 5A and 5B show the calculation results of the electric field distributions of a mode to guide light in the x direction for a wavelength of 600 nm and thicknesses t of 238 nm and 539 nm, respectively, at which there are peaks in FIG. 4. For comparison, FIG. 5C shows the results of similar calculations for a thickness t of 300 nm, at which there is no peak. In these calculations, as in the above calculations, the periodic structure was a one-dimensional periodic structure uniform in the y direction. In each figure, a black region indicates a higher electric field intensity, whereas a white region indicates a lower electric field intensity. Whereas the results for t=238 nm and t=539 nm show high electric field intensity, the results for t=300 nm shows low electric field intensity as a whole. This is because there are guided modes for t=238 nm and t=539 nm so that light is strongly confined. Furthermore, regions with the highest electric field intensity (that is, antinodes) are necessarily present in or directly below the projections, indicating the correlation between the electric field and the periodic structure 120. Thus, the resulting guided mode depends on the arrangement of the periodic structure 120. A comparison between the results for t=238 nm and t=539 nm shows that these modes differ in the number of nodes (white regions) of the electric field in the z direction by one.

3-3. Polarization Dependence

Figure 6:
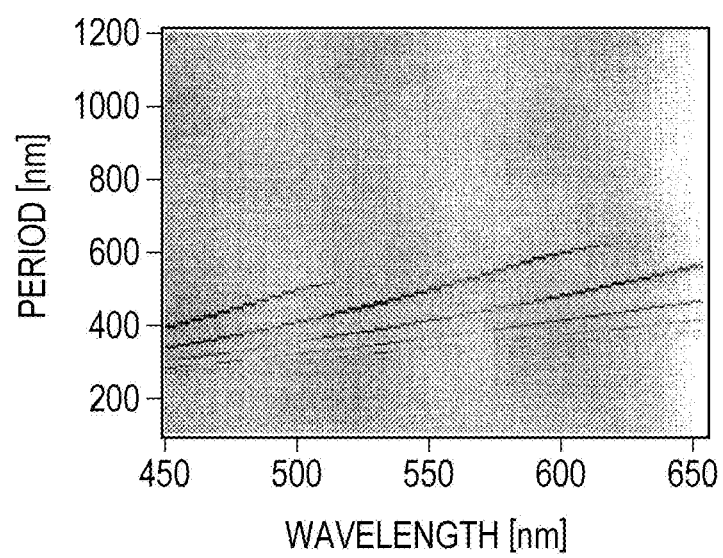
FIG. 6 is a graph showing the calculation results of the enhancement of light performed under the same conditions as in FIG. 2 except that the polarization of the light was assumed to be the TE mode, which has an electric field component perpendicular to the y direction.

To examine the polarization dependence, the enhancement of light was calculated under the same conditions as in FIG. 2 except that the polarization of the light was assumed to be the TE mode, which has an electric field component perpendicular to the y direction. FIG. 6 shows the results of these calculations. Although the peaks in FIG. 6 differ slightly in position from the peaks for the TM mode (FIG. 2), they are located within the regions shown in FIG. 3. This demonstrates that the structure according to this embodiment is effective for both of the TM mode and the TE mode.

3-4. Two-Dimensional Periodic Structure

Figure 7A:
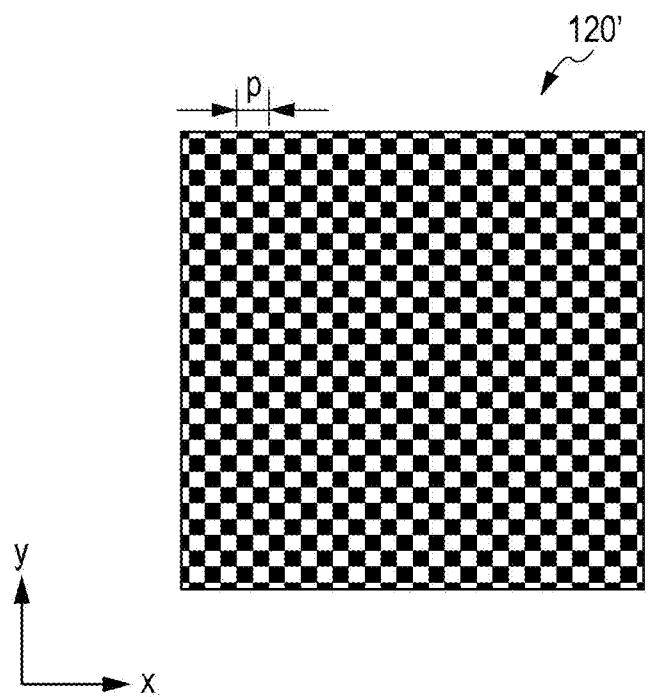
FIG. 7A is a plan view of a two-dimensional periodic structure.
Figure 7B:
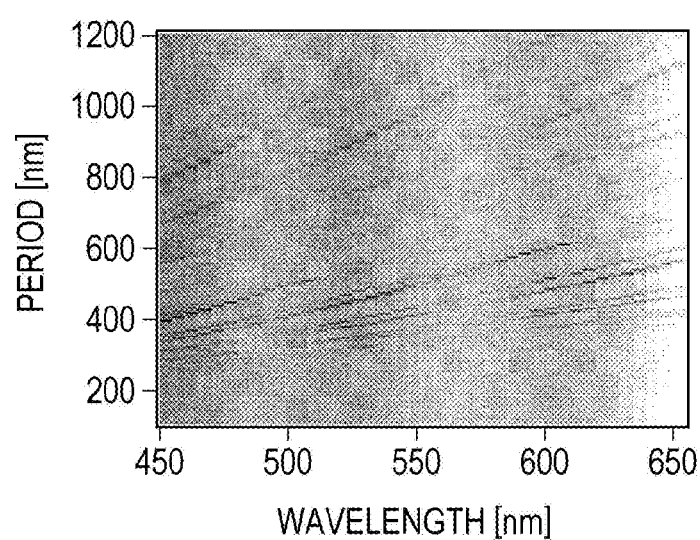
FIG. 7B is a graph showing the results of calculations performed as in FIG. 2 for the two-dimensional periodic structure.

The effect of a two-dimensional periodic structure was also studied. FIG. 7A is a partial plan view of a two-dimensional periodic structure 120' including recesses and projections arranged in both of the x direction and the y direction. In FIG. 7A, the black regions indicate the projections, and the white regions indicate the recesses. For a two-dimensional periodic structure, both of the diffraction in the x direction and the diffraction in the y direction have to be taken into account. Although the diffraction in only the x direction or the y direction is similar to that in a one-dimensional periodic structure, a two-dimensional periodic structure can be expected to give different results from a one-dimensional periodic structure because diffraction also occurs in a direction containing both of an x component and a y component (for example, a direction inclined at 45 degrees). FIG. 7B shows the calculation results of the enhancement of light for the two-dimensional periodic structure. The calculations were performed under the same conditions as in FIG. 2 except for the type of periodic structure. As shown in FIG. 7B, peaks matching the peaks for the TE mode in FIG. 6 were observed in addition to peaks matching the peaks for the TM mode in FIG. 2. These results demonstrate that the two-dimensional periodic structure also converts and outputs the TE mode by diffraction. For a two-dimensional periodic structure, the diffraction that simultaneously satisfies the first-order diffraction conditions in both of the x direction and the y direction also has to be taken into account. Such diffracted light is output in the direction at the angle corresponding to $\sqrt{2}$ times (that is, $2^{1/2}$ times) the period p. Thus, peaks will occur at $\sqrt{2}$ times the period p in addition to peaks that occur in a one-dimensional periodic structure. Such peaks are observed in FIG. 7B.

Figure 18A:
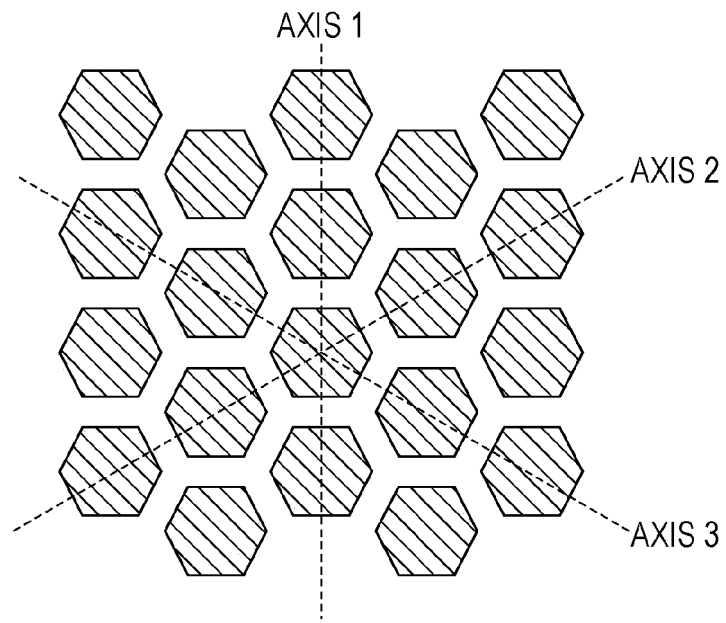
FIG. 18A is a schematic view of a two-dimensional periodic structure.
Figure 18B:
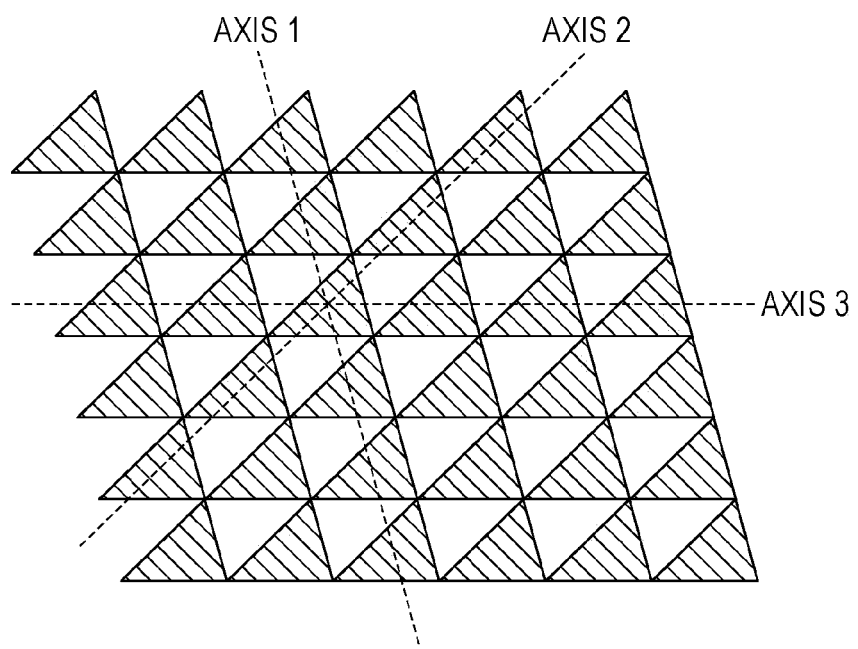
FIG. 18B is a schematic view of another two-dimensional periodic structure.

The two-dimensional periodic structure does not have to be a square grid structure having equal periods in the x direction and the y direction, as illustrated in FIG. 7A, but may be a hexagonal grid structure, as illustrated in FIG. 18A, or a triangular grid structure, as illustrated in FIG. 18B. The two-dimensional periodic structure may have different periods in different directions (for example, in the x direction and the y direction for a square grid structure).

In this embodiment, as demonstrated above, light in a characteristic quasi-guided mode formed by the periodic structure and the photoluminescent layer can be selectively output only in the front direction through diffraction by the periodic structure. With this structure, the photoluminescent layer can be excited with excitation light such as ultraviolet light or blue light to output directional light.

4. Study on Constructions of Periodic Structure and Photoluminescent Layer

The effects of changes in various conditions such as the constructions and refractive indices of the periodic structure and the photoluminescent layer will now be described.

4-1. Refractive Index of Periodic Structure

Figure 8:
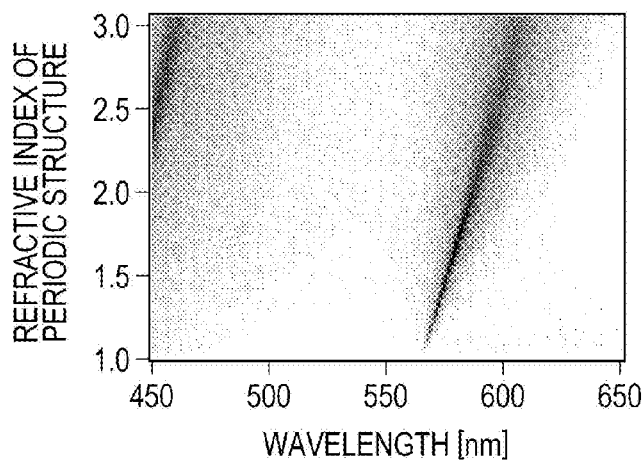
FIG. 8 is a graph showing the calculation results of the enhancement of light output in the front direction with varying emission wavelengths and varying refractive indices of the periodic structure.
Figure 9:
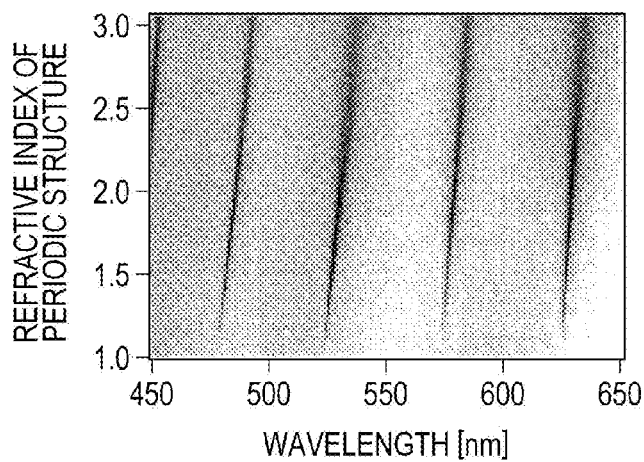
FIG. 9 is a graph showing the results obtained under the same conditions as in FIG. 8 except that the photoluminescent layer was assumed to have a thickness of 1,000 nm.

The refractive index of the periodic structure was studied. In the calculations performed herein, the photoluminescent layer was assumed to have a thickness of 200 nm and a refractive index $n_{wav}$ of 1.8, the periodic structure was assumed to be a one-dimensional periodic structure uniform in the y direction, as shown in FIG. 1A, having a height of 50 nm and a period of 400 nm, and the polarization of the light was assumed to be the TM mode, which has an electric field component parallel to the y direction. FIG. 8 shows the calculation results of the enhancement of light output in the front direction with varying emission wavelengths and varying refractive indices of the periodic structure. FIG. 9 shows the results obtained under the same conditions except that the photoluminescent layer was assumed to have a thickness of 1,000 nm.

The results show that a photoluminescent layer having a thickness of 1,000 nm (FIG. 9) results in a smaller shift in the wavelength at which the light intensity peaks (referred to as a peak wavelength) with the change in the refractive index of the periodic structure than a photoluminescent layer having a thickness of 200 nm (FIG. 8). This is because the quasi-guided mode is more affected by the refractive index of the periodic structure as the photoluminescent layer is thinner. Specifically, a periodic structure having a higher refractive index increases the effective refractive index and thus shifts the peak wavelength toward longer wavelengths, and this effect is more noticeable as the photoluminescent layer is thinner. The effective refractive index is determined by the refractive index of the medium present in the region where the electric field of the quasi-guided mode is distributed.

The results also show that a periodic structure having a higher refractive index results in a broader peak and a lower intensity. This is because a periodic structure having a higher refractive index outputs light in the quasi-guided mode at a higher rate and is therefore less effective in confining the light, that is, has a lower Q value. To maintain a high peak intensity, a structure may be employed in which light is moderately output using a quasi-guided mode that is effective in confining the light (that is, has a high Q value). This means that it is undesirable to use a periodic structure made of a material having a much higher refractive index than the photoluminescent layer. Thus, in order to increase the peak intensity and Q value, the refractive index of a dielectric material constituting the periodic structure (that is, the light-transmissive layer) can be lower than or similar to the refractive index of the photoluminescent layer. This is also true if the photoluminescent layer contains materials other than photoluminescent materials.

4-2. Height of Periodic Structure

Figure 10:
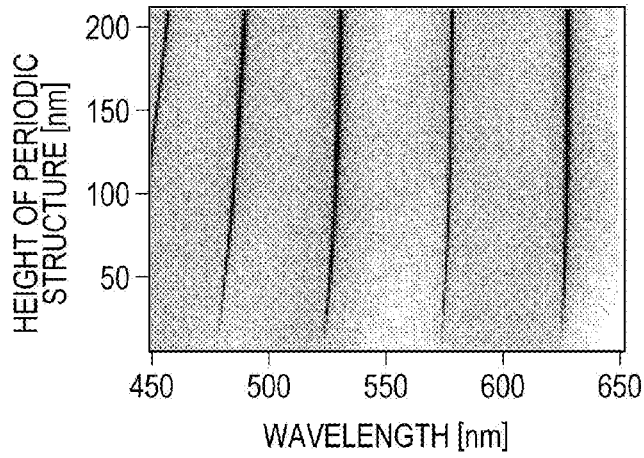
FIG. 10 is a graph showing the calculation results of the enhancement of light output in the front direction with varying emission wavelengths and varying heights of the periodic structure.
Figure 11:
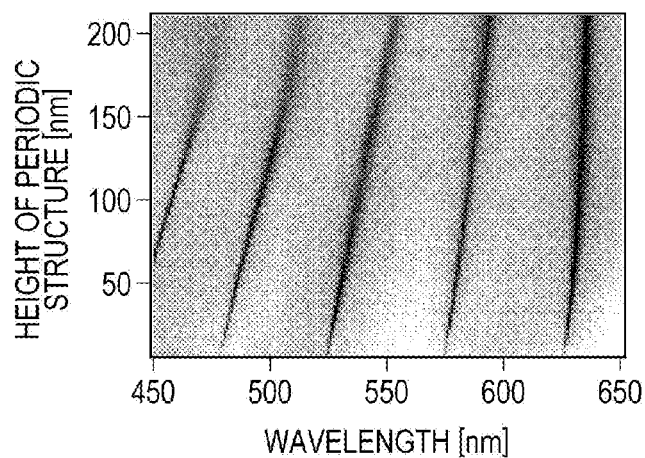
FIG. 11 is a graph showing the results of calculations performed under the same conditions as in FIG. 10 except that the periodic structure was assumed to have a refractive index $n_p$ of 2.0.

The height of the periodic structure was then studied. In the calculations performed herein, the photoluminescent layer was assumed to have a thickness of 1,000 nm and a refractive index $n_{wav}$ of 1.8, the periodic structure was assumed to be a one-dimensional periodic structure uniform in the y direction, as shown in FIG. 1A, having a refractive index $n_p$ of 1.5 and a period of 400 nm, and the polarization of the light was assumed to be the TM mode, which has an electric field component parallel to the y direction. FIG. 10 shows the calculation results of the enhancement of light output in the front direction with varying emission wavelengths and varying heights of the periodic structure. FIG. 11 shows the results of calculations performed under the same conditions except that the periodic structure was assumed to have a refractive index $n_p$ of 2.0. Whereas the results in FIG. 10 show that the peak intensity and the Q value (that is, the peak line width) do not change above a certain height of the periodic structure, the results in FIG. 11 show that the peak intensity and the Q value decrease with increasing height of the periodic structure. If the refractive index $n_{wav}$ of the photoluminescent layer is higher than the refractive index $n_p$ of the periodic structure (FIG. 10), the light is totally reflected, and only a leaking (that is, evanescent) portion of the electric field of the quasi-guided mode interacts with the periodic structure. If the periodic structure has a sufficiently large height, the influence of the interaction between the evanescent portion of the electric field and the periodic structure remains constant irrespective of the height. In contrast, if the refractive index $n_{wav}$ of the photoluminescent layer is lower than the refractive index $n_p$ of the periodic structure (FIG. 11), the light reaches the surface of the periodic structure without being totally reflected and is therefore more influenced by a periodic structure with a larger height. As shown in FIG. 11, a height of approximately 100 nm is sufficient, and the peak intensity and the Q value decrease above a height of 150 nm. Thus, if the refractive index $n_{wav}$ of the photoluminescent layer is lower than the refractive index $n_p$ of the periodic structure, the periodic structure may have a height of 150 nm or less to achieve a high peak intensity and Q value.

4-3. Polarization Direction

Figure 12:
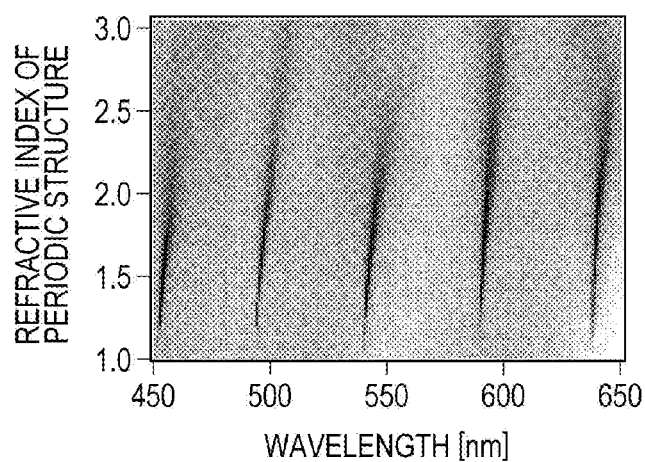
FIG. 12 is a graph showing the results of calculations performed under the same conditions as in FIG. 9 except that the polarization of the light was assumed to be the TE mode, which has an electric field component perpendicular to the y direction.

The polarization direction was then studied. FIG. 12 shows the results of calculations performed under the same conditions as in FIG. 9 except that the polarization of the light was assumed to be the TE mode, which has an electric field component perpendicular to the y direction. The TE mode is more influenced by the periodic structure than the TM mode because the electric field of the quasi-guided mode leaks more largely for the TE mode than for the TM mode. Thus, the peak intensity and the Q value decrease more significantly for the TE mode than for the TM mode if the refractive index $n_p$ of the periodic structure is higher than the refractive index $n_{wav}$ of the photoluminescent layer.

4-4. Refractive Index of Photoluminescent Layer

Figure 13:
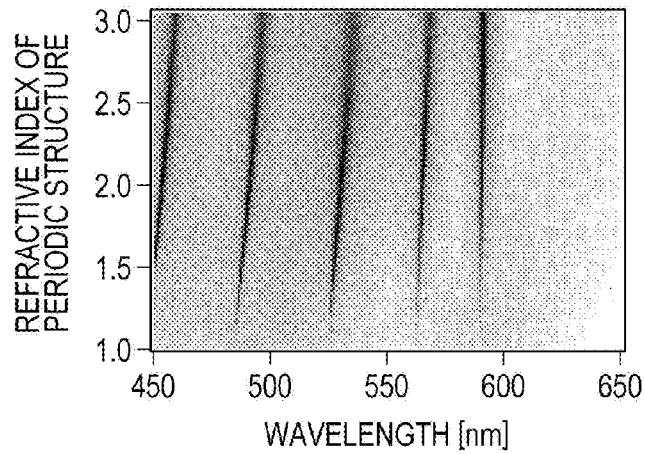
FIG. 13 is a graph showing the results of calculations performed under the same conditions as in FIG. 9 except that the photoluminescent layer was assumed to have a refractive index $n_{wav}$ of 1.5.

The refractive index of the photoluminescent layer was then studied. FIG. 13 shows the results of calculations performed under the same conditions as in FIG. 9 except that the photoluminescent layer was assumed to have a refractive index $n_{wav}$ of 1.5. The results for the photoluminescent layer having a refractive index $n_{wav}$ of 1.5 are similar to the results in FIG. 9. However, light having a wavelength of 600 nm or more was not output in the front direction. This is because, from the inequality (10), $\lambda_0 < n_{wav} \times p/m = 1.5 \times 400$ nm/1=600 nm.

The above analysis demonstrates that a high peak intensity and Q value can be achieved if the periodic structure has a refractive index lower than or similar to the refractive index of the photoluminescent layer or if the periodic structure has a higher refractive index than the photoluminescent layer and a height of 150 nm or less.

5. Modified Examples

Modified Examples of the present embodiment will be described below.

5-1. Structure Including Substrate

As described above, the light-emitting device may have a structure in which the photoluminescent layer 110 and the periodic structure 120 are formed on the transparent substrate 140, as illustrated in FIGS. 1C and 1D. Such a light-emitting device 100a may be produced by forming a thin film of the photoluminescent material for the photoluminescent layer 110 (optionally containing a matrix material; the same applies hereinafter) on the transparent substrate 140 and then forming the periodic structure 120 thereon. In this structure, the refractive index $n_s$ of the transparent substrate 140 has to be lower than or equal to the refractive index $n_{wav}$ of the photoluminescent layer 110 so that the photoluminescent layer 110 and the periodic structure 120 function to output light in a particular direction. If the transparent substrate 140 is provided in contact with the photoluminescent layer 110, the period p has to be set so as to satisfy the inequality (15), which is given by replacing the refractive index $n_{out}$ of the output medium in the inequality (10) by $n_s$.

Figure 14:
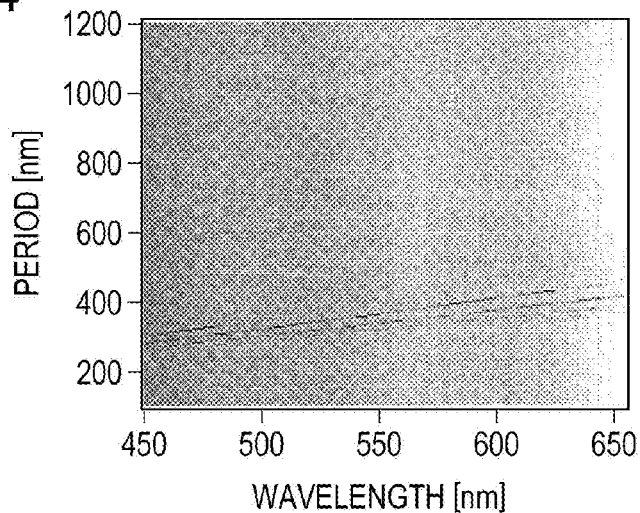
FIG. 14 is a graph showing the results of calculations performed under the same conditions as in FIG. 2 except that the photoluminescent layer and the periodic structure were assumed to be located on a transparent substrate having a refractive index of 1.5.
Figure 15:
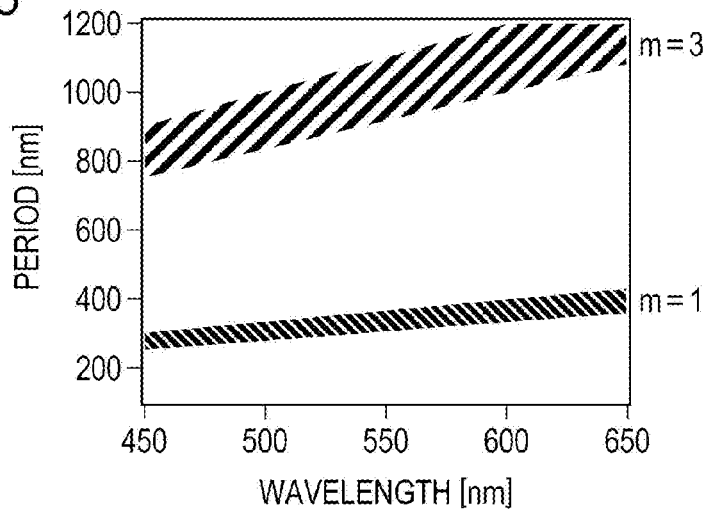
FIG. 15 is a graph illustrating the condition represented by the inequality (15)

To demonstrate this, calculations were performed under the same conditions as in FIG. 2 except that the photoluminescent layer 110 and the periodic structure 120 were assumed to be located on a transparent substrate 140 having a refractive index of 1.5. FIG. 14 shows the results of these calculations. As in the results in FIG. 2, light intensity peaks are observed at particular periods for each wavelength, although the ranges of periods where peaks appear differ from those in FIG. 2. FIG. 15 is a graph illustrating the condition represented by the inequality (15), which is given by substituting $n_{out} = n_s$ into the inequality (10). In FIG. 14, light intensity peaks are observed in the regions corresponding to the ranges shown in FIG. 15.

Thus, for the light-emitting device 100a, in which the photoluminescent layer 110 and the periodic structure 120 are located on the transparent substrate 140, a period p that satisfies the inequality (15) is effective, and a period p that satisfies the inequality (13) is significantly effective.

5-2. Light-Emitting Apparatus Including Excitation Light Source

Figure 16:
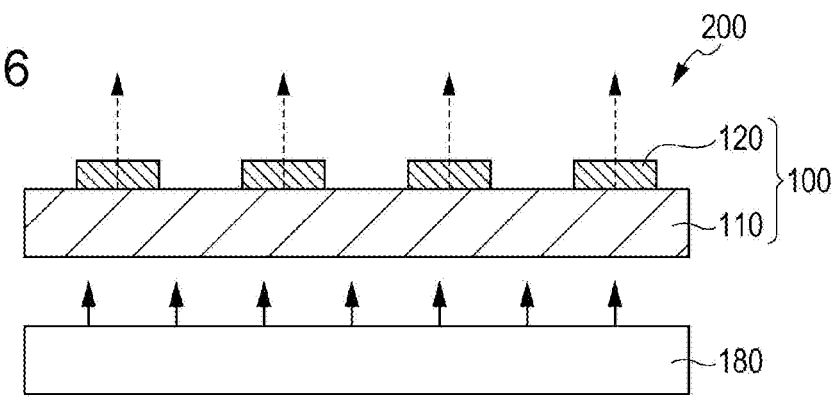
FIG. 16 is a schematic view of a light-emitting apparatus including a light-emitting device illustrated in FIGS. 1A and 1B and a light source that directs excitation light into a photoluminescent layer.

FIG. 16 is a schematic view of a light-emitting apparatus 200 including the light-emitting device 100 illustrated in FIGS. 1A and 1B and a light source 180 that emits excitation light toward the photoluminescent layer 110. In this embodiment, as described above, the photoluminescent layer can be excited with excitation light such as ultraviolet light or blue light to output directional light. The light source 180 can be configured to emit such excitation light to provide a directional light-emitting apparatus 200. Although the wavelength of the excitation light emitted from the light source 180 is typically within the ultraviolet or blue range, it is not necessarily within these ranges, but may be determined depending on the photoluminescent material for the photoluminescent layer 110. Although the light source 180 illustrated in FIG. 16 is configured to direct excitation light into the bottom surface of the photoluminescent layer 110, it may be configured otherwise, for example, to direct excitation light into the top surface of the photoluminescent layer 110.

Figure 17A:
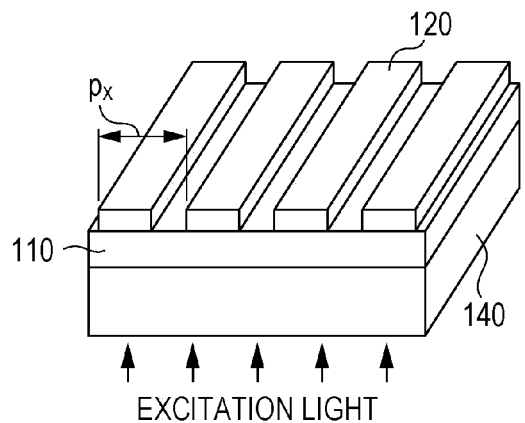
FIGS. 17A to 17D illustrate structures in which excitation light is coupled into a quasi-guided mode to efficiently output light.
Figure 17B:
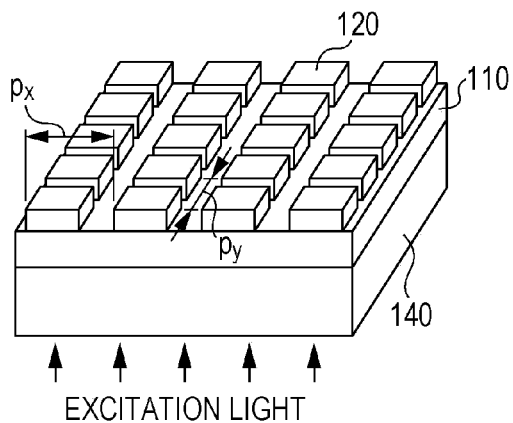

The excitation light may be coupled into a quasi-guided mode to efficiently output light. FIGS. 17A to 17D illustrate this method. In this example, as in the structure illustrated in FIGS. 1C and 1D, the photoluminescent layer 110 and the periodic structure 120 are formed on the transparent substrate 140. As illustrated in FIG. 17A, the period $p_x$ in the x direction is first determined so as to enhance light emission. As illustrated in FIG. 17B, the period $p_y$ in the y direction is then determined so as to couple the excitation light into a quasi-guided mode. The period $p_x$ is determined so as to satisfy the condition given by replacing p in the inequality (10) by $p_x$. The period $p_y$ is determined so as to satisfy the inequality (16):

$$\frac{m\lambda_{ex}}{n_{wav}} < p_y < \frac{m\lambda_{ex}}{n_{out}} \qquad (16)$$

wherein m is an integer of 1 or more, $\lambda_{ex}$ is the wavelength of the excitation light, and $n_{out}$ is the refractive index of the medium having the highest refractive index of the media in contact with the photoluminescent layer 110 except the periodic structure 120.

In the example in FIGS. 17A to 17D, $n_{out}$ is the refractive index $n_s$ of the transparent substrate 140. For a structure including no transparent substrate 140, as illustrated in FIG. 16, $n_{out}$ denotes the refractive index of air (approximately 1.0).

In particular, the excitation light can be more effectively converted into a quasi-guided mode if m=1, that is, if the period $p_y$ is determined so as to satisfy the inequality (17):

$$\frac{\lambda_{ex}}{n_{wav}} < p_y < \frac{\lambda_{ex}}{n_{out}} \qquad (17)$$

Thus, the excitation light can be converted into a quasi-guided mode if the period $p_y$ is set so as to satisfy the condition represented by the inequality (16) (particularly, the condition represented by the inequality (17)). As a result, the photoluminescent layer 110 can efficiently absorb the excitation light of the wavelength $\lambda_{ex}$.

Figure 17C:
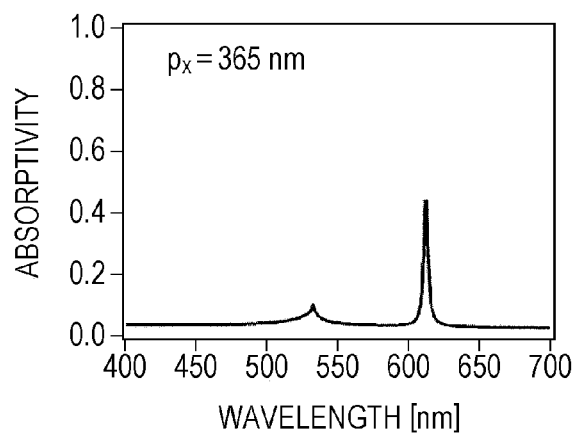
Figure 17D:
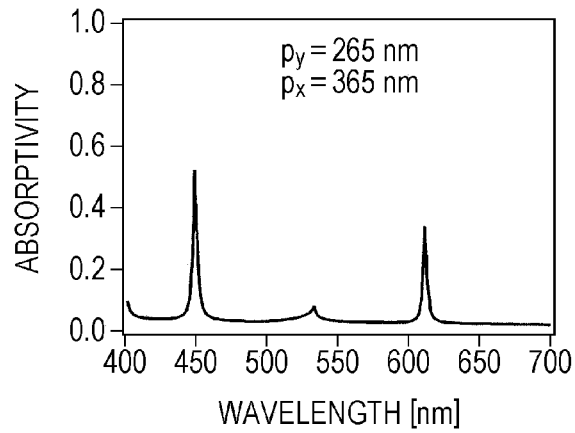

FIGS. 17C and 17D are the calculation results of the proportion of absorbed light to light incident on the structures illustrated in FIGS. 17A and 17B, respectively, for each wavelength. In these calculations, $p_x$=365 nm, $p_y$=265 nm, the photoluminescent layer 110 was assumed to have an emission wavelength $\lambda$ of about 600 nm, the excitation light was assumed to have a wavelength $\lambda_{ex}$ of about 450 nm, and the photoluminescent layer 110 was assumed to have an extinction coefficient of 0.003. As shown in FIG. 17D, the photoluminescent layer 110 has high absorptivity not only for the light emitted from the photoluminescent layer 110 but also for the excitation light, that is, light having a wavelength of approximately 450 nm. This indicates that the incident light is effectively converted into a quasi-guided mode to increase the proportion of the light absorbed into the photoluminescent layer 110. The photoluminescent layer 110 also has high absorptivity for the emission wavelength, that is, approximately 600 nm. This indicates that light having a wavelength of approximately 600 nm incident on this structure is similarly effectively converted into a quasi-guided mode. The periodic structure 120 shown in FIG. 17B is a two-dimensional periodic structure including structures having different periods (that is, different periodic components) in the x direction and the y direction. Such a two-dimensional periodic structure including periodic components allows for high excitation efficiency and high output intensity. Although the excitation light is incident on the transparent substrate 140 in FIGS. 17A and 17B, the same effect can be achieved even if the excitation light is incident on the periodic structure 120.

Also available are two-dimensional periodic structures including periodic components as shown in FIGS. 18A and 18B. The structure illustrated in FIG. 18A includes periodically arranged projections or recesses having a hexagonal planar shape. The structure illustrated in FIG. 18B includes periodically arranged projections or recesses having a triangular planar shape. These structures have major axes (axes 1 to 3 in the examples in FIGS. 18A and 18B) that can be assumed to be periodic. Thus, the structures can have different periods in different axial directions. These periods may be set so as to increase the directionality of light beams of different wavelengths or to efficiently absorb the excitation light. In any case, each period is set so as to satisfy the condition corresponding to the inequality (10).

5-3. Periodic Structure on Transparent Substrate

Figure 19A:
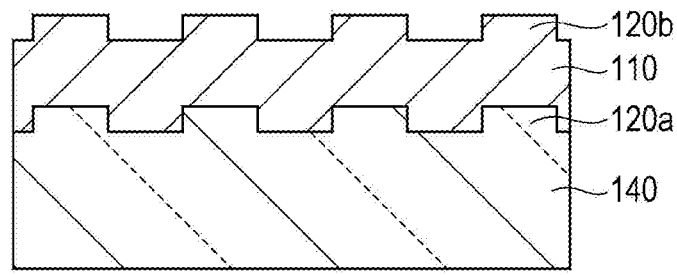
FIG. 19A is a schematic view of a modified example in which a periodic structure is formed on a transparent substrate.
Figure 19B:
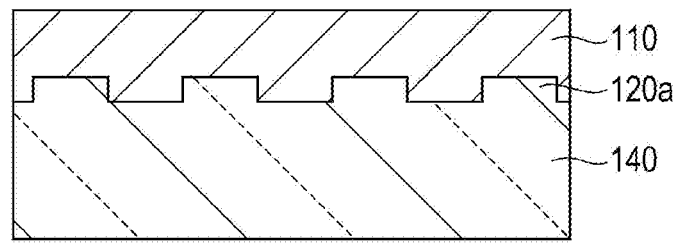
FIG. 19B is a schematic view of another modified example in which a periodic structure is formed on a transparent substrate.

As illustrated in FIGS. 19A and 19B, a periodic structure 120a may be formed on the transparent substrate 140, and the photoluminescent layer 110 may be located thereon. In the example in FIG. 19A, the photoluminescent layer 110 is formed along the texture of the periodic structure 120a on the transparent substrate 140. As a result, a periodic structure 120b with the same period is formed in the surface of the photoluminescent layer 110. In the example in FIG. 19B, the surface of the photoluminescent layer 110 is flattened. In these examples, directional light emission can be achieved by setting the period p of the periodic structure 120a so as to satisfy the inequality (15).

Figure 19C:
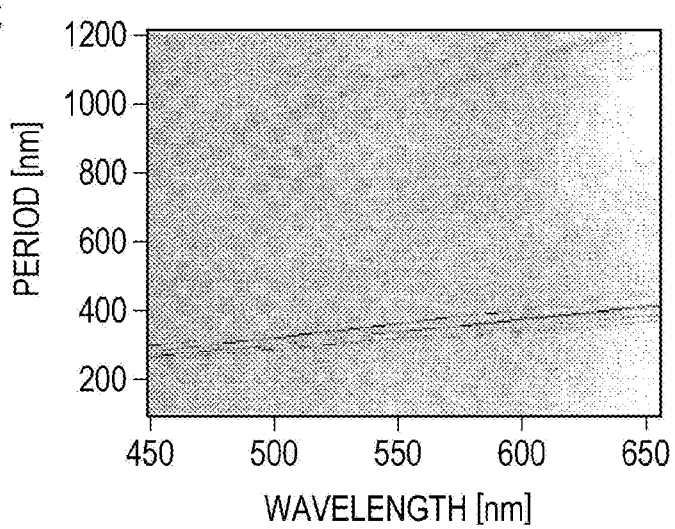
FIG. 19C is a graph showing the calculation results of the enhancement of light output from the structure illustrated in FIG. 19A in the front direction with varying emission wavelengths and varying periods of the periodic structure.

To verify the effect of these structures, the enhancement of light output from the structure in FIG. 19A in the front direction was calculated with varying emission wavelengths and varying periods of the periodic structure. In these calculations, the photoluminescent layer 110 was assumed to have a thickness of 1,000 nm and a refractive index $n_{wav}$ of 1.8, the periodic structure 120a was assumed to be a one-dimensional periodic structure uniform in the y direction having a height of 50 nm, a refractive index $n_p$ of 1.5, and a period of 400 nm, and the polarization of the light was assumed to be the TM mode, which has an electric field component parallel to the y direction. FIG. 19C shows the results of these calculations. In these calculations, light intensity peaks were observed at the periods that satisfy the condition represented by the inequality (15).

5-4. Powder

According to the above embodiment, light of any wavelength can be enhanced by adjusting the period of the periodic structure and the thickness of the photoluminescent layer. For example, if the structure illustrated in FIGS. 1A and 1B is formed using a photoluminescent material that emits light over a wide wavelength range, only light of a certain wavelength can be enhanced. Accordingly, the structure of the light-emitting device 100 as illustrated in FIGS. 1A and 1B may be provided in powder form for use as a fluorescent material. Alternatively, the light-emitting device 100 as illustrated in FIGS. 1A and 1B may be embedded in resin or glass.

Figure 20:
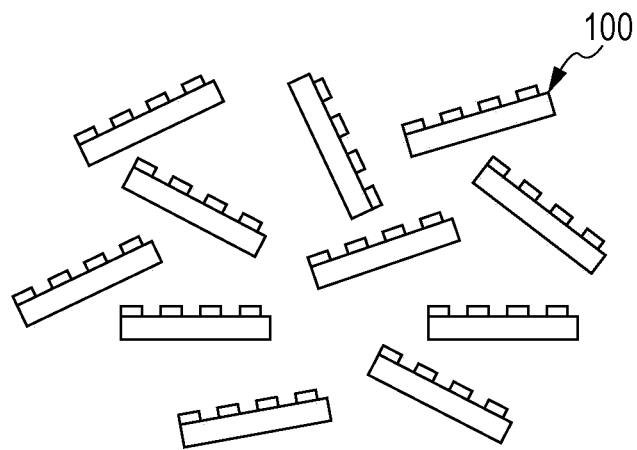
FIG. 20 is a schematic view of a mixture of light-emitting devices in powder form.

The single structure as illustrated in FIGS. 1A and 1B can output only light of a certain wavelength in a particular direction and is therefore not suitable for outputting, for example, white light, which has a wide wavelength spectrum. Accordingly, as shown in FIG. 20, light-emitting devices 100 that differ in the conditions such as the period of the periodic structure and the thickness of the photoluminescent layer may be mixed in powder form to provide a light-emitting apparatus with a wide wavelength spectrum. In such a case, the individual light-emitting devices 100 have sizes of, for example, several micrometers to several millimeters in one direction and can include, for example, one- or two-dimensional periodic structures with several periods to several hundreds of periods.

5-5. Array of Structures Having Different Periods

Figure 21:
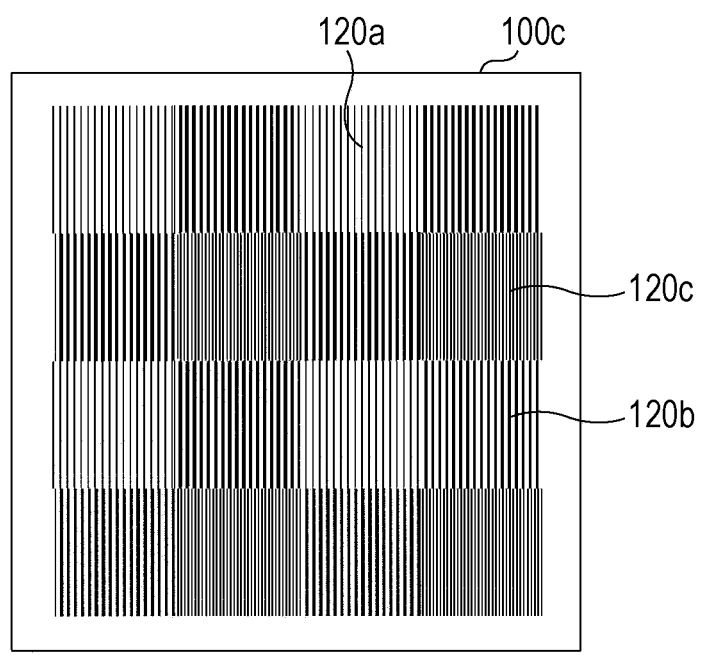
FIG. 21 is a plan view of a two-dimensional array of periodic structures having different periods on the photoluminescent layer.

FIG. 21 is a plan view of a two-dimensional array of periodic structures having different periods on the photoluminescent layer. In this example, three types of periodic structures 120a, 120b, and 120c are arranged without any space therebetween. The periods of the periodic structures 120a, 120b, and 120c are set so as to output, for example, light in the red, green, and blue wavelength ranges, respectively, in the front direction. Thus, structures having different periods can be arranged on the photoluminescent layer to output directional light with a wide wavelength spectrum. The periodic structures are not necessarily configured as described above, but may be configured in any manner.

5-6. Layered Structure

Figure 22:
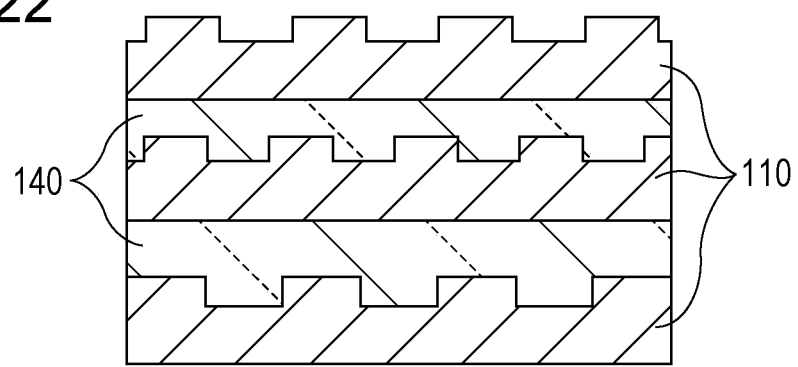
FIG. 22 is a schematic view of a light-emitting device including photoluminescent layers each having a textured surface.

FIG. 22 illustrates a light-emitting device including photoluminescent layers 110 each having a textured surface. A transparent substrate 140 is located between the photoluminescent layers 110. The texture on each of the photoluminescent layers 110 corresponds to the periodic structure or the submicron structure. The example in FIG. 22 includes three periodic structures having different periods. The periods of these periodic structures are set so as to output light in the red, green, and blue wavelength ranges in the front direction. The photoluminescent layer 110 in each layer is made of a material that emits light of the color corresponding to the period of the periodic structure in that layer. Thus, periodic structures having different periods can be stacked on top of each other to output directional light with a wide wavelength spectrum.

The number of layers and the constructions of the photoluminescent layer 110 and the periodic structure in each layer are not limited to those described above, but may be selected as appropriate. For example, for a structure including two layers, first and second photoluminescent layers are formed opposite each other with a light-transmissive substrate therebetween, and first and second periodic structures are formed on the surfaces of the first and second photoluminescent layers, respectively. In such a case, the first photoluminescent layer and the first periodic structure may together satisfy the condition corresponding to the inequality (15), whereas the second photoluminescent layer and the second periodic structure may together satisfy the condition corresponding to the inequality (15). For a structure including three or more layers, the photoluminescent layer and the periodic structure in each layer may satisfy the condition corresponding to the inequality (15). The positional relationship between the photoluminescent layers and the periodic structures in FIG. 22 may be reversed. Although the layers illustrated by the example in FIG. 22 have different periods, they may all have the same period. In such a case, although the spectrum cannot be broadened, the emission intensity can be increased.

5-7. Structure Including Protective Layer

Figure 23:
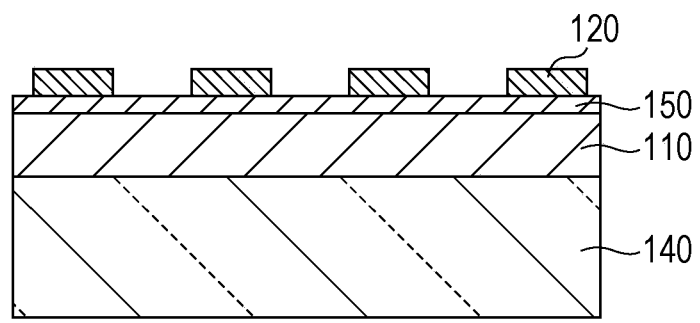
FIG. 23 is a cross-sectional view of a structure including a protective layer between a photoluminescent layer and a periodic structure.

FIG. 23 is a cross-sectional view of a structure including a protective layer 150 between the photoluminescent layer 110 and the periodic structure 120. The protective layer 150 may be provided to protect the photoluminescent layer 110. However, if the protective layer 150 has a lower refractive index than the photoluminescent layer 110, the electric field of the light leaks into the protective layer 150 only by about half the wavelength. Thus, if the protective layer 150 is thicker than the wavelength, no light reaches the periodic structure 120. As a result, there is no quasi-guided mode, and the function of outputting light in a particular direction cannot be achieved. If the protective layer 150 has a refractive index higher than or similar to that of the photoluminescent layer 110, the light reaches the interior of the protective layer 150; therefore, there is no limitation on the thickness of the protective layer 150. Nevertheless, a thinner protective layer 150 is desirable because more light is output if most of the portion in which light is guided (this portion is hereinafter referred to as "waveguide layer") is made of a photoluminescent material. The protective layer 150 may be made of the same material as the periodic structure (light-transmissive layer) 120. In such a case, the light-transmissive layer 120 having the periodic structure functions as a protective layer. The light-transmissive layer 120 desirably has a lower refractive index than the photoluminescent layer 110.

6. Materials and Production Methods

Directional light emission can be achieved if the photoluminescent layer (or waveguide layer) and the periodic structure are made of materials that satisfy the above conditions. The periodic structure may be made of any material. However, a photoluminescent layer (or waveguide layer) or a periodic structure made of a medium with high light absorption is less effective in confining light and therefore results in a lower peak intensity and Q value. Thus, the photoluminescent layer (or waveguide layer) and the periodic structure may be made of media with relatively low light absorption.

For example, the periodic structure may be formed of a dielectric material having low light absorptivity. Examples of candidate materials for the periodic structure include magnesium fluoride ($MgF_2$), lithium fluoride (LiF), calcium fluoride ($CaF_2$), quartz ($SiO_2$), glasses, resins, magnesium oxide (MgO), indium tin oxide (ITO), titanium oxide ($TiO_2$), silicon nitride (SiN), tantalum pentoxide ($Ta_2O_5$), zirconia ($ZrO_2$), zinc selenide (ZnSe), and zinc sulfide (ZnS). To form a periodic structure having a lower refractive index than the photoluminescent layer, as described above, $MgF_2$, LiF, $CaF_2$, $SiO_2$, glasses, and resins can be used, which have refractive indices of approximately 1.3 to 1.5.

The term "photoluminescent material" encompasses fluorescent materials and phosphorescent materials in a narrow sense, encompasses inorganic materials and organic materials (for example, dyes), and encompasses quantum dots (that is, tiny semiconductor particles). In general, a fluorescent material containing an inorganic host material tends to have a higher refractive index. Examples of fluorescent materials that emit blue light include $M_{10}(PO_4)_6Cl_2:Eu^{2+}$ (wherein M is at least one element selected from Ba, Sr, and Ca), $BaMgAl_{10}O_{17}:Eu^{2+}$, $M_3MgSi_2O_8:Eu^{2+}$ (wherein M is at least one element selected from Ba, Sr, and Ca), and $M_5SiO_4Cl_6:Eu^{2+}$ (wherein M is at least one element selected from Ba, Sr, and Ca). Examples of fluorescent materials that emit green light include $M_2MgSi_2O_7:Eu^{2+}$ (wherein M is at least one element selected from Ba, Sr, and Ca), $SrSi_5AlO_2N_7:Eu^{2+}$, $SrSi_2O_2N_2:Eu^{2+}$, $BaAl_2O_4:Eu^{2+}$, $BaZrSi_3O_9:Eu^{2+}$, $M_2SiO_4:Eu^{2+}$ (wherein M is at least one element selected from Ba, Sr, and Ca), $BaSi_3O_4N_2:Eu^{2+}$, $Ca_8Mg(SiO_4)_4Cl_2:Eu^{2+}$, $Ca_3SiO_4Cl_2:Eu^{2+}$, $CaSi_{12-(m+n)}Al_{(m+n)}O_6N_{16-n}:Ce^{3+}$, and $\beta$-SiAlON:$Eu^{2+}$. Examples of fluorescent materials that emit red light include $CaAlSiN_3:Eu^{2+}$, $SrAlSi_4O_7:Eu^{2+}$, $M_2Si_5N_8:Eu^{2+}$ (wherein M is at least one element selected from Ba, Sr, and Ca), $MSiN_2:Eu^{2+}$ (wherein M is at least one element selected from Ba, Sr, and Ca), $MSi_2O_2N_2:Yb^{2+}$ (wherein M is at least one element selected from Sr and Ca), $Y_2O_2S:Eu^{3+}$, $Sm^{3+}$, $La_2O_2S:Eu^{3+}$, $Sm^{3+}$, $CaWO_4:Li^{1+}$, $Eu^{3+}$, $Sm^{3+}$, $M_2SiS_4:Eu^{2+}$ (wherein M is at least one element selected from Ba, Sr, and Ca), and $M_3SiO_5:Eu^{2+}$ (wherein M is at least one element selected from Ba, Sr, and Ca). Examples of fluorescent materials that emit yellow light include $Y_3Al^5O_{12}:Ce^{3+}$, $CaSi_2O_2N_2:Eu^{2+}$, $Ca_3Sc_2Si_3O_{12}:Ce^{3+}$, $CaSc_2O_4:Ce^{3+}$, $\alpha$-SiAlON:$Eu^{2+}$, $MSi_2O_2N_2:Eu^{2+}$ (wherein M is at least one element selected from Ba, Sr, and Ca), and $M_7(SiO_3)_6Cl_2:Eu^{2+}$ (wherein M is at least one element selected from Ba, Sr, and Ca).

Examples of quantum dots include materials such as CdS, CdSe, core-shell CdSe/ZnS, and alloy CdSSe/ZnS. Light of various wavelengths can be emitted depending on the material. Examples of matrices for quantum dots include glasses and resins.

The transparent substrate 140, as shown in, for example, FIGS. 1C and 1D, is made of a light-transmissive material having a lower refractive index than the photoluminescent layer 110. Examples of such materials include magnesium fluoride ($MgF_2$), lithium fluoride (LiF), calcium fluoride ($CaF_2$), quartz ($SiO_2$), glasses, and resins.

Exemplary production methods will be described below.

Figure 24:
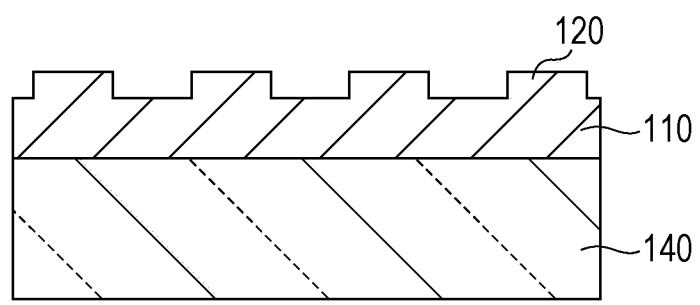
FIG. 24 is a cross-sectional view of a structure including a periodic structure formed by processing only a portion of a photoluminescent layer.

A method for forming the structure illustrated in FIGS. 1C and 1D includes forming a thin film of the photoluminescent layer 110 on the transparent substrate 140, for example, by evaporation, sputtering, or coating of a fluorescent material, forming a dielectric film, and then patterning the dielectric film, for example, by photolithography to form the periodic structure 120. Alternatively, the periodic structure 120 may be formed by nanoimprinting. As shown in FIG. 24, the periodic structure 120 may also be formed by partially processing the photoluminescent layer 110. In such a case, the periodic structure 120 is made of the same material as the photoluminescent layer 110.

The light-emitting device 100 illustrated in FIGS. 1A and 1B can be manufactured, for example, by fabricating the light-emitting device 100a illustrated in FIGS. 1C and 1D and then stripping the photoluminescent layer 110 and the periodic structure 120 from the substrate 140.

The structure shown in FIG. 19A can be manufactured, for example, by forming the periodic structure 120a on the transparent substrate 140 by a process such as a semiconductor manufacturing processes or nanoimprinting and then depositing thereon the material for the photoluminescent layer 110 by a process such as evaporation or sputtering. The structure shown in FIG. 19B can be manufactured by filling the recesses in the periodic structure 120a with the photoluminescent layer 110 by a process such as coating.

The above methods of manufacture are for illustrative purposes only, and the light-emitting devices according to the embodiments of the present disclosure may be manufactured by other methods.

Experimental Examples

Light-emitting devices according to embodiments of the present disclosure are illustrated by the following examples.

A sample light-emitting device having the structure as illustrated in FIG. 19A was prepared and evaluated for its properties. The light-emitting device was prepared as described below.

Figure 25:
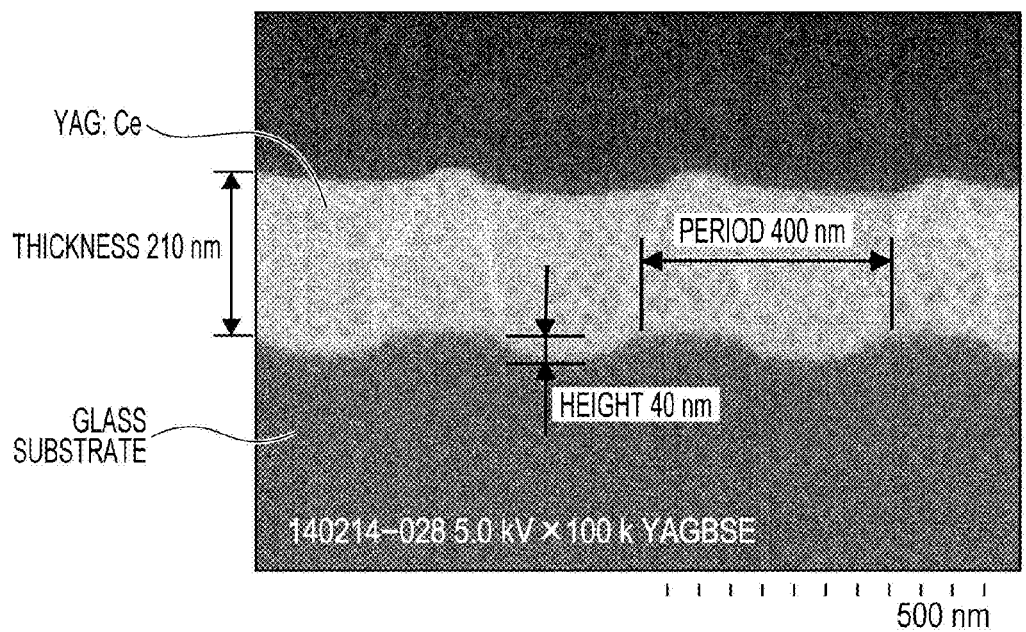
FIG. 25 is a cross-sectional transmission electron microscopy (TEM) image of a photoluminescent layer formed on a glass substrate having a periodic structure.
Figure 26:
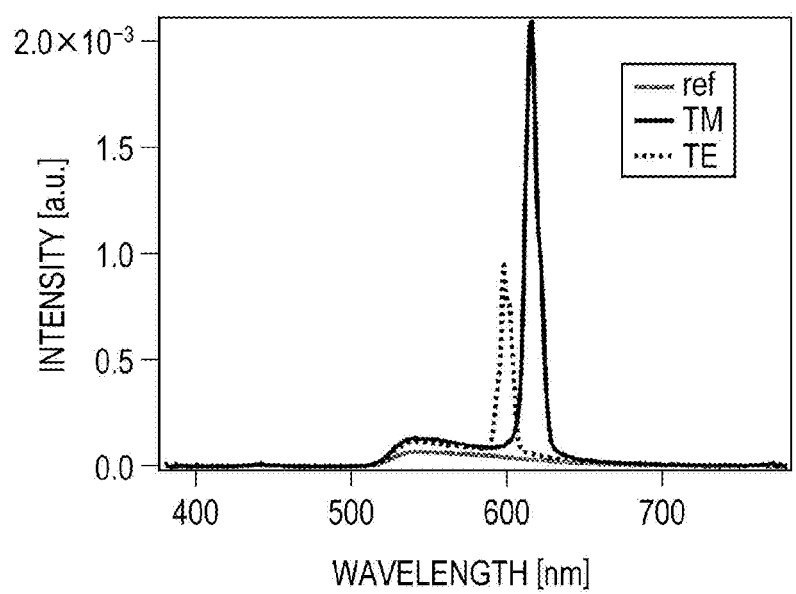
FIG. 26 is a graph showing the results of measurements of the spectrum of light output from a sample light-emitting device in the front direction.

A one-dimensional periodic structure (stripe-shaped projections) having a period of 400 nm and a height of 40 nm was formed on a glass substrate, and a photoluminescent material, that is, YAG:Ce, was deposited thereon to a thickness of 210 nm. FIG. 25 shows a cross-sectional transmission electron microscopy (TEM) image of the resulting light-emitting device. FIG. 26 shows the results of measurements of the spectrum of light emitted from the light-emitting device in the front direction when YAG:Ce was excited with an LED having an emission wavelength of 450 nm. FIG. 26 shows the results (ref) for a light-emitting device including no periodic structure, the results for the TM mode, and the results for the TE mode. The TM mode has a polarization component parallel to the one-dimensional periodic structure. The TE mode has a polarization component perpendicular to the one-dimensional periodic structure. The results show that the intensity of light of a particular wavelength in the case with the periodic structure is significantly higher than without a periodic structure. The results also show that the light enhancement effect is greater for the TM mode, which has a polarization component parallel to the one-dimensional periodic structure.

Figure 27A:
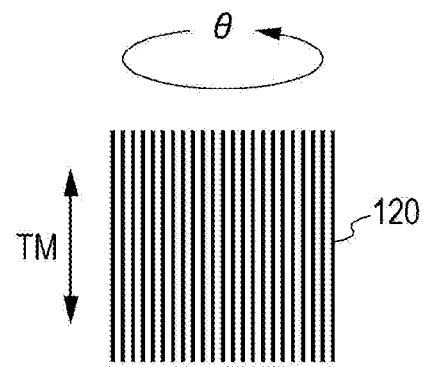
FIG. 27A is a schematic view of a light-emitting device that can emit linearly polarized light of the TM mode, rotated about an axis parallel to the line direction of the one-dimensional periodic structure.
Figure 27B:
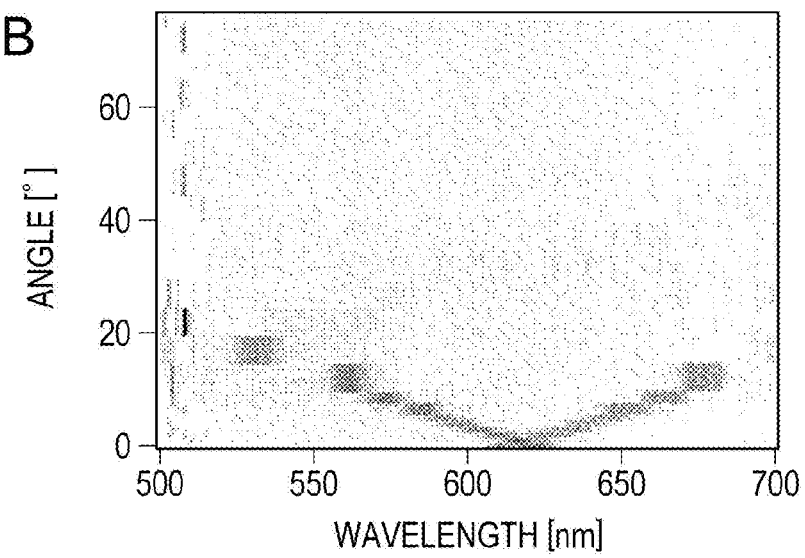
FIG. 27B is a graph showing the results of measurements of the angular dependence of light output from the sample light-emitting device rotated as illustrated in FIG. 27A.
Figure 27C:
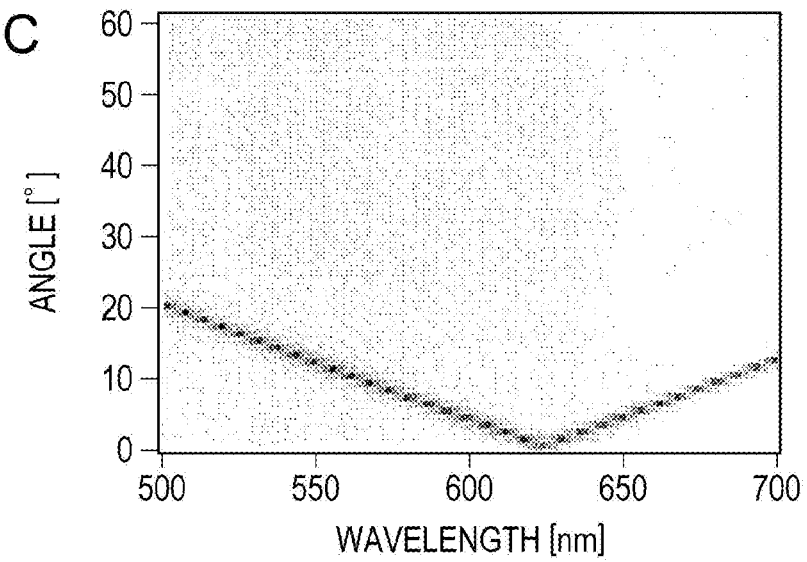
FIG. 27C is a graph showing the results of calculations of the angular dependence of light output from the sample light-emitting device rotated as illustrated in FIG. 27A.
Figure 27D:
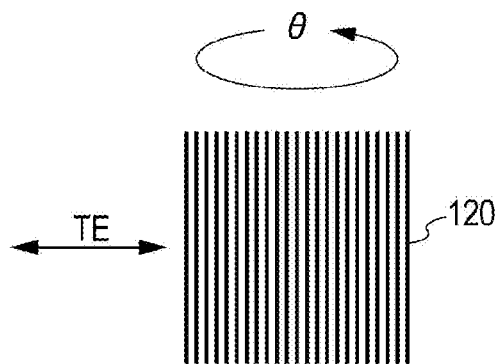
FIG. 27D is a schematic view of a light-emitting device that can emit linearly polarized light of the TE mode, rotated about an axis parallel to the line direction of the one-dimensional periodic structure.
Figure 27E:
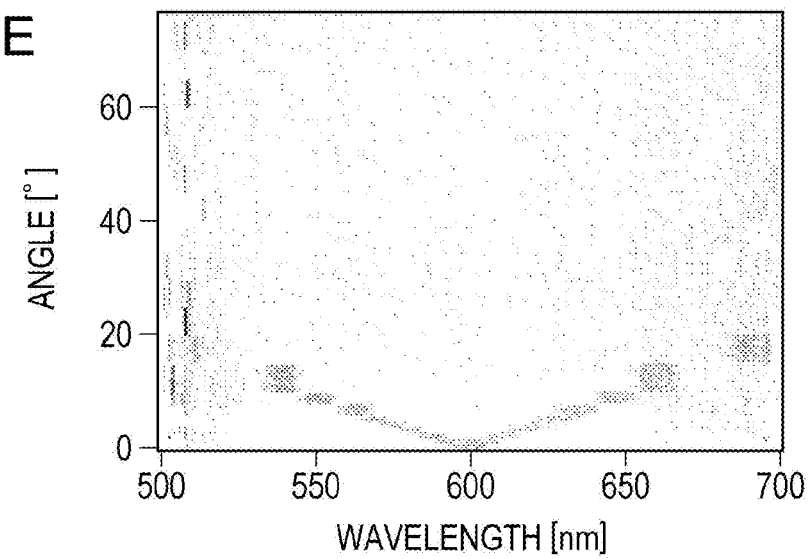
FIG. 27E is a graph showing the results of measurements of the angular dependence of light output from the sample light-emitting device rotated as illustrated in FIG. 27D.
Figure 27F:
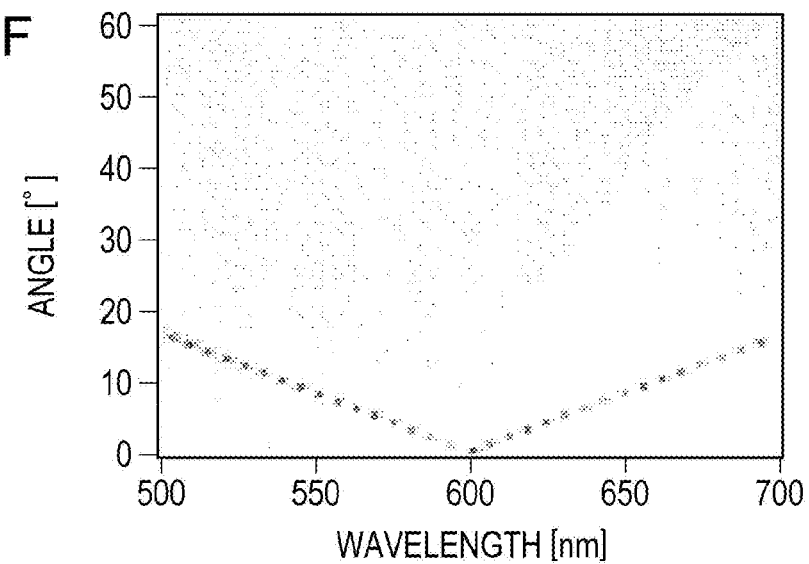
FIG. 27F is a graph showing the results of calculations of the angular dependence of light output from the sample light-emitting device rotated as illustrated in FIG. 27D.
Figure 28A:
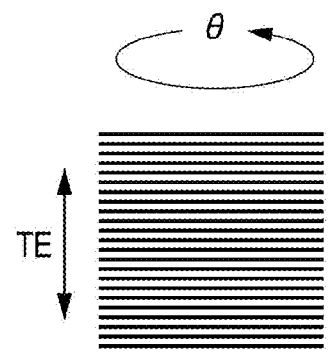
FIG. 28A is a schematic view of a light-emitting device that can emit linearly polarized light of the TE mode, rotated about an axis perpendicular to the line direction of the one-dimensional periodic structure.
Figure 28B:
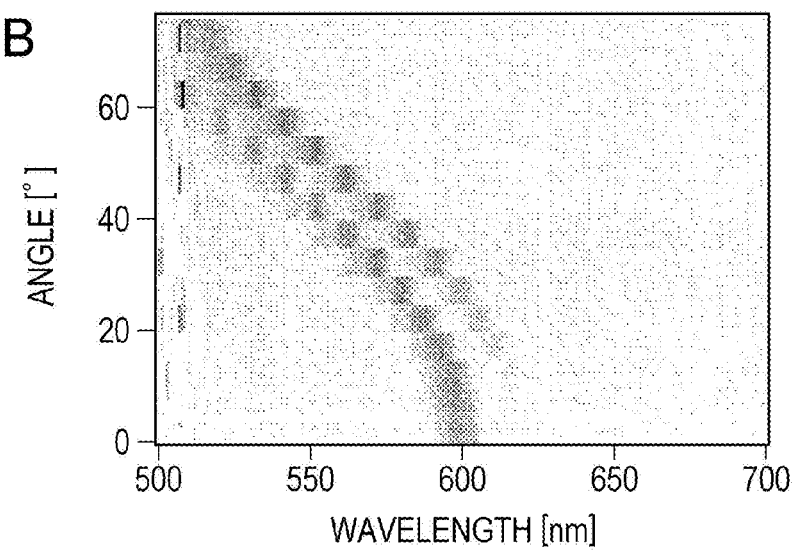
FIG. 28B is a graph showing the results of measurements of the angular dependence of light output from the sample light-emitting device rotated as illustrated in FIG. 28A.
Figure 28C:
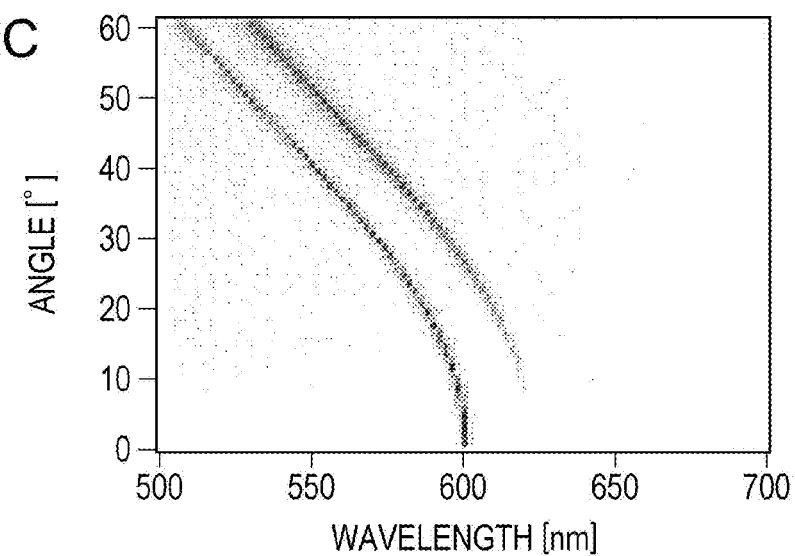
FIG. 28C is a graph showing the results of calculations of the angular dependence of light output from the sample light-emitting device rotated as illustrated in FIG. 28A.
Figure 28D:
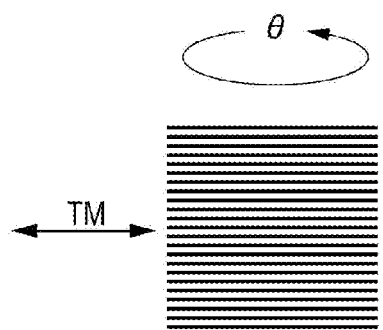
FIG. 28D is a schematic view of a light-emitting device that can emit linearly polarized light of the TM mode, rotated about an axis perpendicular to the line direction of the one-dimensional periodic structure.
Figure 28E:
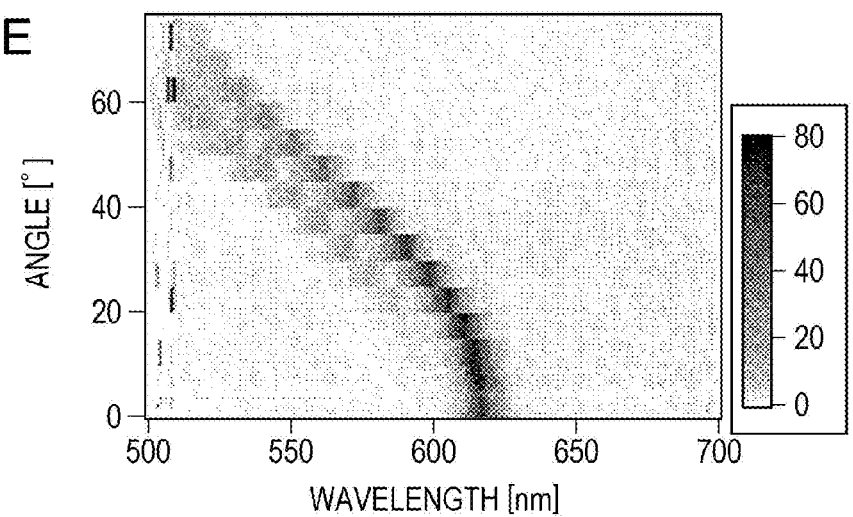
FIG. 28E is a graph showing the results of measurements of the angular dependence of light output from the sample light-emitting device rotated as illustrated in FIG. 28D.
Figure 28F:
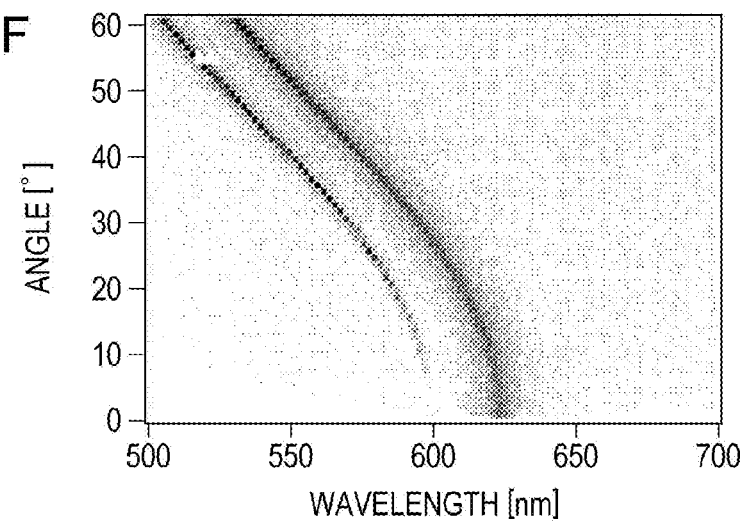
FIG. 28F is a graph showing the results of calculations of the angular dependence of light output from the sample light-emitting device rotated as illustrated in FIG. 28D.

FIGS. 27A to 27F and FIGS. 28A to 28F show the results of measurements and calculations of the angular dependence of the intensity of light output from the same sample. FIGS. 27B and 27E show the results of measurements and FIGS. 27C and 27F show the results of calculations for rotation about an axis parallel to the line direction of the one-dimensional periodic structure (that is, the periodic structure 120). FIGS. 28B and 28E show the results of measurements and FIGS. 28C and 28F show the results of calculations for rotation about an axis perpendicular to the line direction of the one-dimensional periodic structure (that is, the periodic structure 120).

FIGS. 27A to 27F and FIGS. 28A to 28F show the results for linearly polarized light in the TM mode and the TE mode. FIG. 27A shows the results for linearly polarized light in the TM mode. FIGS. 27D to 27F show the results for linearly polarized light in the TE mode. FIGS. 28A to 28C show the results for linearly polarized light in the TE mode. FIGS. 28D to 28F show the results for linearly polarized light in the TM mode. As can be seen from FIGS. 27A to 27F and FIGS. 28A to 28F, the enhancement effect is greater for the TM mode, and the enhanced wavelength shifts with angle. For example, light having a wavelength of 610 nm is observed only in the TM mode and in the front direction, indicating that the light is directional and polarized. In addition, the top and bottom parts of each figure match each other. Thus, the validity of the above calculations was experimentally demonstrated.

Figure 29:
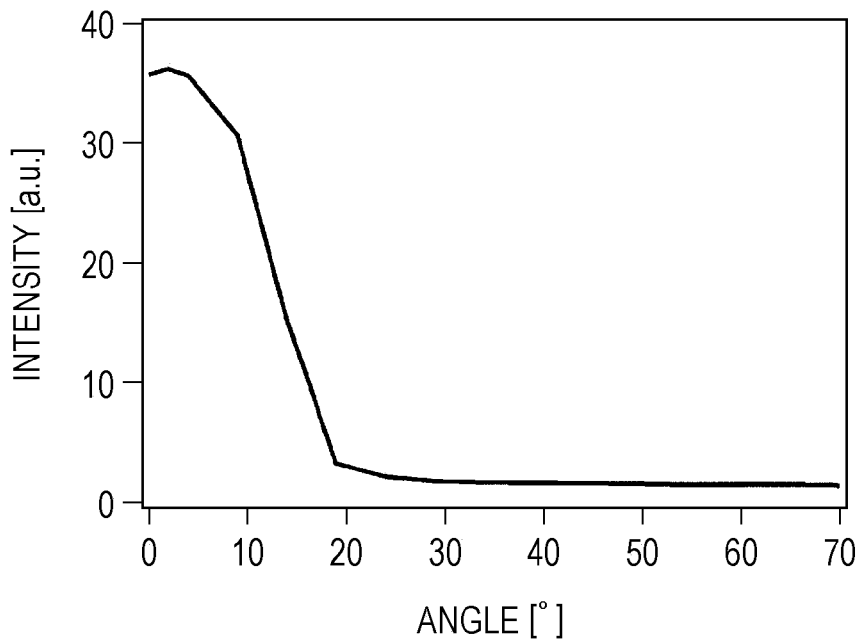
FIG. 29 is a graph showing the results of measurements of the angular dependence of light (wavelength: 610 nm) output from the sample light-emitting device.

Among the above results of measurements, for example, FIG. 29 shows the angular dependence of the intensity of light having a wavelength of 610 nm for rotation about an axis perpendicular to the line direction. As shown in FIG. 29, the light was significantly enhanced in the front direction and was little enhanced at other angles. The directional angle of the light output in the front direction is less than 15 degrees. The directional angle is the angle at which the intensity is 50% of the maximum intensity and is expressed as the angle of one side with respect to the direction with the maximum intensity. This demonstrates that directional light emission was achieved. In addition, all the light was in the TM mode, which demonstrates that polarized light emission was simultaneously achieved.

Although YAG:Ce, which emits light in a wide wavelength range, was used in the above experiment, directional and polarized light emission can also be achieved using a similar structure including a photoluminescent material that emits light in a narrow wavelength range. Such a photoluminescent material does not emit light of other wavelengths and can therefore be used to provide a light source that does not emit light in other directions or in other polarized states.

7. Embodiments Including Multilayer Mirror

Embodiments including a multilayer mirror will be described below.

Figure 31:
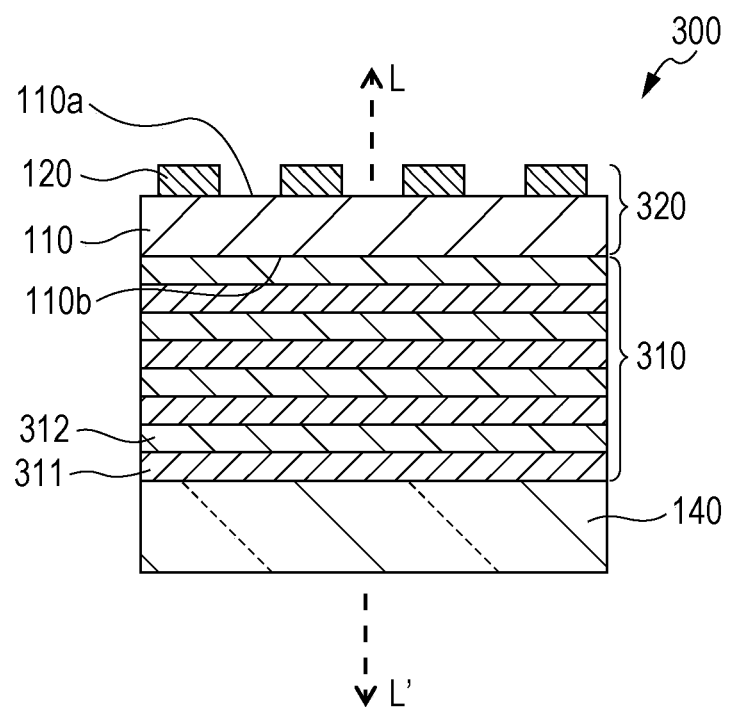
FIG. 31 is a schematic view of a light-emitting device including a multilayer mirror according to an embodiment.

FIG. 31 is a cross-sectional view of a light-emitting device 300 according to the present embodiment. As in light-emitting devices according to other embodiments, the light-emitting device 300 includes a photoluminescent layer 110 and a light-transmissive layer having a periodic structure (for example, a submicron structure) 120 located on or near the photoluminescent layer 110. Light emitted from the photoluminescent layer 110 in response to excitation light is coupled into a particular quasi-guided mode depending on the periodic structure 120. Light coupled into the quasi-guided mode is emitted from the photoluminescent layer 110 through the periodic structure 120 as propagating light L having high directionality in a particular direction. In the present embodiment, propagating light L is emitted in the front direction (in the direction normal to a main surface 110a).

The light-emitting device 300 further includes a multilayer mirror 310 on the other main surface 110b of the photoluminescent layer 110. The multilayer mirror 310 is layered together with the photoluminescent layer 110 and the periodic structure 120. The multilayer mirror 310 may be located on a transparent substrate 140. The multilayer mirror 310 is also referred to as a dielectric reflective film, a dielectric mirror, or a dielectric multilayer film and prevents propagating light from being emitted from the light-emitting device 300 through the other main surface 110b of the photoluminescent layer 110. This can increase the intensity of propagating light L emitted from the main surface 110a on which the multilayer mirror 310 is not located.

The multilayer mirror 310 includes at least one high-refractive-index layer 311 and at least one low-refractive-index layer 312. The multilayer mirror 310 may include high-refractive-index layers 311 and low-refractive-index layers 312. In such a case, the high-refractive-index layers 311 and the low-refractive-index layers 312 are alternately stacked on top of one another, and a greater number of layers have greater effects. The high-refractive-index layers 311 have a higher refractive index than the low-refractive-index layers 312.

The low-refractive-index layer 312 and the high-refractive-index layer 311 have refractive indices $n_L$ and $n_H$, respectively. The low-refractive-index layer 312 and the high-refractive-index layer 311 have thicknesses $t_{ML}$ and $t_{MH}$, respectively. $m_R$ is a positive integer (natural number). $m_R$ in the low-refractive-index layers 312 and the high-refractive-index layers 311 may be the same or different. If the multilayer mirror 310 satisfies the following formula, the multilayer mirror 310 can utilize the interference of light to reflect light with the highest efficiency.

$$t_{ML}=(2m_R-1)\lambda_a/(4n_L)$$

$$t_{MH}=(2m_R-1)\lambda_a/(4n_H)$$

This enhances the optical confinement effect due to the quasi-guided mode in the photoluminescent layer 110 and can increase the intensity of propagating light emitted from the main surface 110a.

The low-refractive-index layer 312 may satisfy $1.3 \leq n_L \leq 1.7$ and may be formed of a material having low absorption for propagating light L. More specifically, the low-refractive-index layer 312 may be formed of a material having a refractive index in this range among various materials exemplified as the materials of periodic structures. The high-refractive-index layer 311 may satisfy $1.5 \leq n_H \leq 2.5$ and may be formed of a material having low absorption for propagating light L. More specifically, the high-refractive-index layer 311 may be formed of a material having a refractive index in this range among various materials exemplified as the materials of periodic structures. The high-refractive-index layer 311 may be formed of the material of the photoluminescent layer 110. This facilitates the production of the light-emitting device.

Figure 32A:
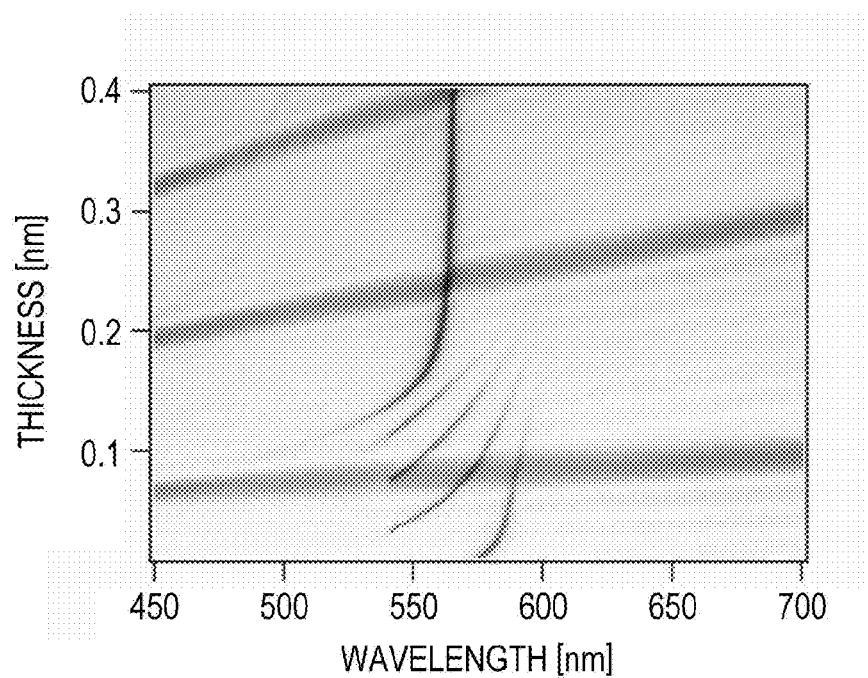
FIG. 32A is a graph showing the calculation results of the relationship between the thickness of a high-refractive-index layer of a multilayer mirror and the wavelength of propagating light and reflectance.
Figure 32B:
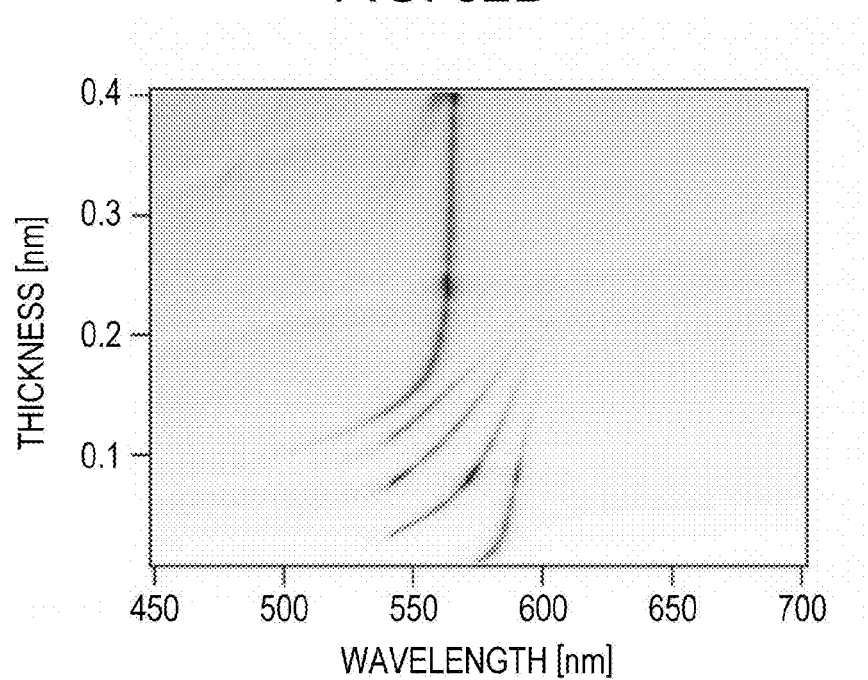
FIG. 32B is a graph showing the calculation results of the relationship between the thickness of a high-refractive-index layer of a multilayer mirror and the wavelength of propagating light and emission intensity.

FIG. 32A shows the calculation results of the relationship between the thickness of the high-refractive-index layer 311 of the multilayer mirror 310 and the wavelength of propagating light and reflectance. FIG. 32B shows the calculation results of the relationship between the thickness of the high-refractive-index layer 311 of the multilayer mirror 310 and the wavelength of propagating light and emission intensity.

The calculation conditions are as follows:
Refractive index $n_L$ of low-refractive-index layer 312: 1.5
Refractive index $n_H$ of high-refractive-index layer 311: 1.75
Number of low-refractive-index layers 312 and high-refractive-index layers 311: 4 layers each
Thickness of low-refractive-index layer 312: 1.17 (=1.75/1.5) times the thickness of high-refractive-index layer Thickness of photoluminescent layer 110: 130 nm
Refractive index of photoluminescent layer 110: 1.75
Period of periodic structure 120: 370 nm
Height of periodic structure 120: 80 nm In FIGS. 32A and 32B, the horizontal axis represents the wavelength of propagating light, and the vertical axis represents the thickness of the high-refractive-index layer 311. In FIG. 32A, shading indicates transmittance, and darker shading indicates higher transmittance. In FIG. 32B, shading indicates emission intensity, and darker shading indicates higher emission intensity.

FIGS. 32A and 32B show that when the wavelength of propagating light is 570 nm, and the high-refractive-index layer 311 has a thickness in the range of approximately 65 to 95 nm, this results in high reflectance of the multilayer mirror 310 and high emission efficiency of propagating light from the main surface 110a of the photoluminescent layer 110 on which the periodic structure 120 is located. When the wavelength of propagating light is 560 nm, and the high-refractive-index layer 311 has a thickness in the range of approximately 225 to 255 nm, this results in high reflectance of the multilayer mirror 310 and high emission efficiency of propagating light from the main surface 110a of the photoluminescent layer 110 on which the periodic structure 120 is located.

These ranges correspond to $0.2\lambda_a/n_H$ to $0.3\lambda_a/n_H$ and $0.7\lambda_a/n_H$ to $0.8\lambda_a/n_H$. If the light-emitting device 300 satisfies the following formula (18), propagating light L can be emitted with high emission efficiency from the light output side, that is, the main surface 110a, irrespective of the conditions for the calculation (the refractive index of each layer, the period and height of the periodic structure, and the thickness of the photoluminescent layer).

$$(2m_R-1.2)\lambda_a/(4n_L) \leq t_{ML} \leq (2m_R-0.8)\lambda_a/(4n_L)$$

$$(2m_R-1.2)\lambda_a/(4n_H) \leq t_{MH} \leq (2m_R-0.8)\lambda_a/(4n_H) \quad (18)$$

The wavelength $\lambda_a$=570 nm and the thickness $t_{MH}$ of the high-refractive-index layer 311=approximately 65 to 95 nm in FIGS. 32A and 32B corresponds to $m_R$=1 in the formula (18). The wavelength $\lambda_a$=560 nm and the thickness $t_{MH}$ of the high-refractive-index layer 311=approximately 225 to 255 nm corresponds to $m_R$=2 in the formula (18). For $m_R$=1, the low-refractive-index layer 312 and the high-refractive-index layer 311 can have the smallest thickness, making the production easier. Thus, the emission efficiency of light emitted from the light-emitting device 300 can be increased in a predetermined range including the thickness at which the multilayer mirror 310 has the highest reflection efficiency.

In the light-emitting device 300, the structure between the multilayer mirror 310 and the light output side of the light-emitting device 300 can be configured to be suitable for the transmission of propagating light in order to further increase the emission efficiency of the light-emitting device 300. More specifically, it is necessary for the light-transmissive structure in the light-emitting device 300 to satisfy the conditions for high emission efficiency of light due to interference. The light-transmissive structure is composed of the photoluminescent layer 110 and layers other than the multilayer mirror 310 through which light emitted from the photoluminescent layer 110 can be transmitted. In the light-emitting device 300 in FIG. 31, a light-transmissive structure 320 is composed of the photoluminescent layer 110 and the periodic structure 120. The substrate 140 is located on the multilayer mirror 310 opposite the photoluminescent layer 110 and is not "a layer through which light emitted from the photoluminescent layer 110 can be transmitted".

The light-transmissive structure 320 satisfies the conditions for high emission intensity of light due to interference. More specifically, the thickness of the light-transmissive structure 320 is set to a range where the reflection due to interference is reduced. The periodic structure 120 has an effective optical path length of $h_p \times n_p \times f$, wherein $h_p$ denotes the height of the periodic structure 120, $n_p$ denotes the refractive index of the periodic structure 120, and f denotes the occupied area (filling rate) on the main surface 110a. The photoluminescent layer 110 has an effective optical path length of $n_W \times t_W$, wherein $n_W$ and $t_W$ denote the refractive index and thickness of the photoluminescent layer 110, respectively.

As illustrated in FIG. 31, the light-transmissive structure 320 is in contact with the multilayer mirror 310. The photoluminescent layer 110 is in contact with the low-refractive-index layer 312 at the interface between the light-transmissive structure 320 and the multilayer mirror 310, and the photoluminescent layer 110 has a higher refractive index than the low-refractive-index layer 312. Thus, light propagating from the multilayer mirror 310 to the light-transmissive structure 320 undergoes free-end reflection (reflection with no phase change) at the interface between the light-transmissive structure 320 and the multilayer mirror 310.

Thus, in total, the effective optical path length $d_T$ of the light-transmissive structure 320 in the stacking direction is $d_T = h_p \times n_p \times f + n_W \times t_W$. If $m_T$ is a positive natural number, and $d_T$ is $m_T \lambda_a / (2 n_{wav-a})$, this allows light to be most efficiently transmitted due to the interference effect. Conversely, if $(2m-1)\lambda_a/(4n_{wav-a})$ is satisfied, this results in the highest reflection of light in the light-transmissive structure 320 and the smallest emission enhancement effect. Thus, the desired range is as follows:

$$(4m_T-1)\lambda_a/(8n_{wav-a}) < d_T < (4m_T+1)\lambda_a/(8n_{wav-a}) \quad (19)$$

Figure 33A:
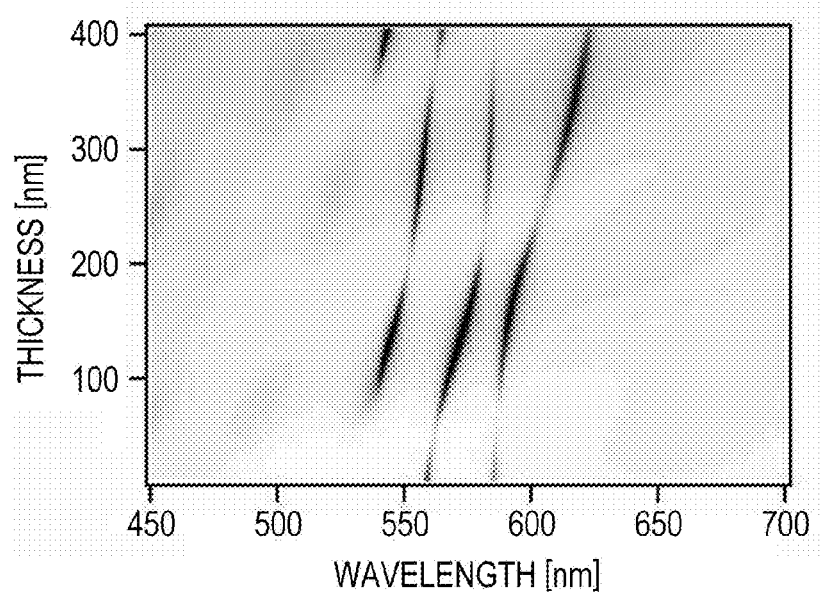
FIG. 33A is a graph showing the calculation results of the relationship between the thickness of a photoluminescent layer and the wavelength of propagating light and the intensity of propagating light output from a periodic structure.
Figure 33B:
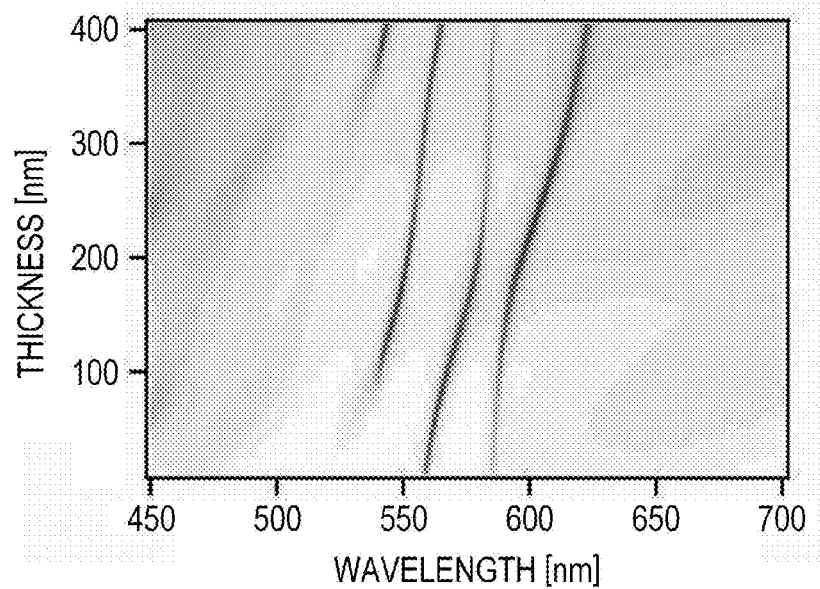
FIG. 33B is a graph showing the calculation results of the relationship between the thickness of a photoluminescent layer and the wavelength of propagating light and the intensity of propagating light output from a transparent substrate.

FIGS. 33A and 33B show the calculation results of the relationship between the thickness of the photoluminescent layer 110 and the wavelength of propagating light and emission intensity. FIG. 33A shows the intensity of light L emitted from the main surface 110a, and FIG. 33B shows the intensity of light L' emitted from the substrate 140.

The calculation conditions are as follows:
Refractive index $n_L$ of low-refractive-index layer 312: 1.5
Refractive index $n_H$ Of high-refractive-index layer 311: 1.75
Thickness of low-refractive-index layer 312: 93 nm
Thickness of high-refractive-index layer 311: 80 nm
Number of low-refractive-index layers 312 and high-refractive-index layers 311: 4 layers each
Refractive index of photoluminescent layer 110: 1.75
Period of periodic structure 120: 370 nm
Height of periodic structure 120: 80 nm
Refractive index of periodic structure 120: 1.5
Filling rate of periodic structure 120: 0.5

In FIGS. 33A and 33B, the horizontal axis represents the wavelength of propagating light, and the vertical axis represents the thickness of the photoluminescent layer. In FIGS. 33A and 33B, shading indicates emission intensity, and darker shading indicates higher emission intensity. FIG. 33A shows that if the wavelength of propagating light is 560 nm, and the thickness of the photoluminescent layer ranges from approximately 85 to 165 nm, the emission intensity is high. Under this condition, the effective optical path length of the periodic structure 120 is $n_p \times h_p \times f = 1.5 \times 80$ nm $\times 0.5 = 60$ nm, and the effective optical path length of the photoluminescent layer is 149 nm $< n_W \times t_W <$ 289 nm. Consequently, 209 nm $< d_T <$ 349 nm. This relationship is in good agreement with the range of $d_T$ represented by the formula (19).

Thus, if the light-emitting device 300 has $d_T$ represented by the formula (19), propagating light L can be emitted with high emission efficiency from the light output side, that is, the main surface 110a, irrespective of the conditions for the calculation.

A comparison of FIG. 33A and FIG. 33B shows that the intensity of light L' emitted from the substrate 140 is much lower than the intensity of light L emitted from the main surface 110a. This shows that the multilayer mirror 310 can efficiently reflect light emitted from the other main surface 110b of the photoluminescent layer 110.

Figure 34:
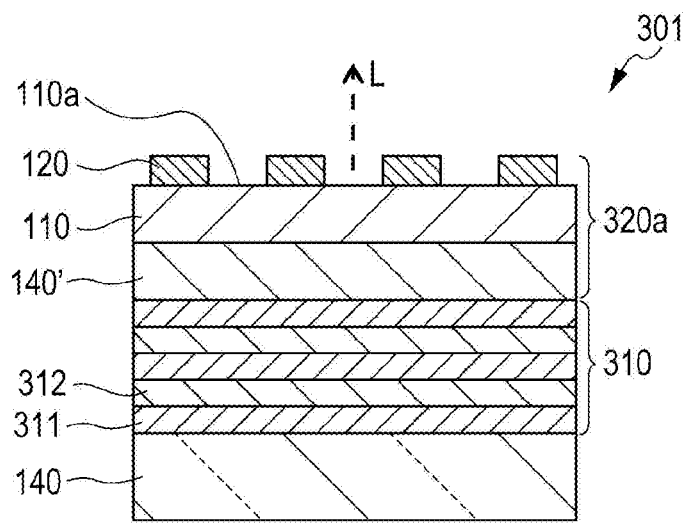
FIG. 34 is a schematic view of a light-emitting device including a multilayer mirror according to another embodiment.

FIG. 34 is a cross-sectional view of a light-emitting device 301 according to another first example of the present embodiment. Like reference numerals denote like parts in FIGS. 31 and 34. The light-emitting device 301 includes a light-transmissive structure 320a including an adjusting layer 140'. More specifically, the light-transmissive structure 320a is composed of a periodic structure 120, a photoluminescent layer 110, and the adjusting layer 140'. In this case, the effective optical path length $d_T$' of the light-transmissive structure 320a is the sum of the effective optical path lengths of the periodic structure 120, the photoluminescent layer 110, and the adjusting layer 140'.

The light-transmissive structure 320a is in contact with the multilayer mirror 310. The adjusting layer 140' is in contact with the high-refractive-index layer 311 at the interface between the light-transmissive structure 320a and the multilayer mirror 310, and the adjusting layer 140' has a lower refractive index than the high-refractive-index layer 311. Thus, light propagating from the multilayer mirror 310 to the light-transmissive structure 320a undergoes fixed-end reflection (reflection with a phase change of π) at the interface between the light-transmissive structure 320a and the multilayer mirror 310. Thus, the desired range of the effective optical path length $d_T$' is different from the formula (19) by $\lambda_a/(4n_{wav-a})$, and it is desirable to satisfy the condition represented by the following formula (20).

$$(4m_T-3)\lambda_a/(8n_{wav-a}) < d_T < (4m_T-1)\lambda_a/(8n_{wav-a}) \quad (20)$$

Figure 35:
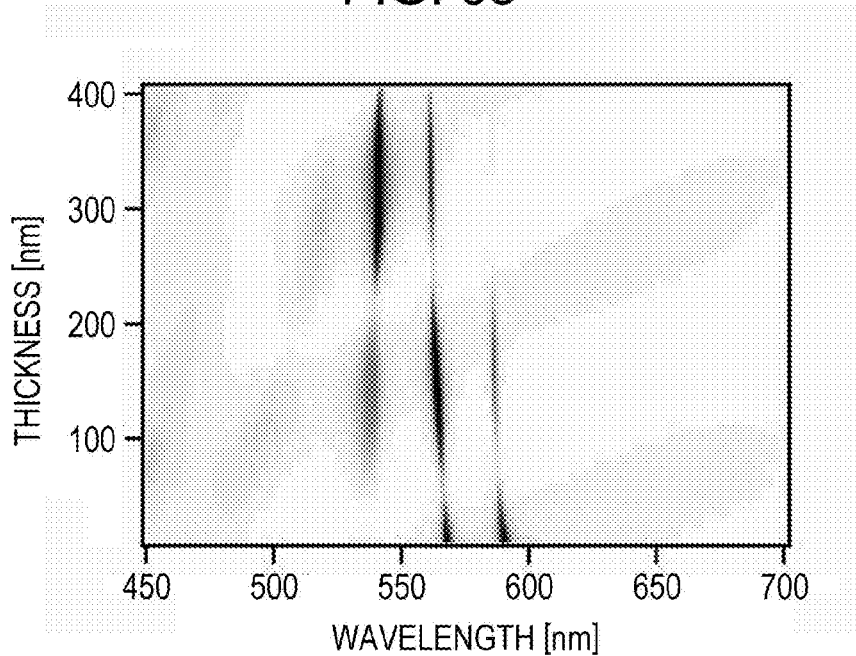
FIG. 35 is a graph showing the calculation results of the relationship between the thickness of a transparent substrate and the wavelength of propagating light and emission intensity.

FIG. 35 shows the calculation results of the relationship between the thickness of the adjusting layer 140' and the wavelength of propagating light and emission intensity. The horizontal axis represents the wavelength of propagating light, and the vertical axis represents the thickness of the adjusting layer 140'. In FIG. 35, shading indicates emission intensity, and darker shading indicates higher emission intensity. The calculation conditions are as follows:
Refractive index $n_L$ of low-refractive-index layer 312: 1.5
Refractive index $n_H$ of high-refractive-index layer 311: 1.75
Thickness of low-refractive-index layer 312: 93 nm
Thickness of high-refractive-index layer 311: 80 nm
Number of low-refractive-index layers 312: 3 layers
Number of high-refractive-index layers 311: 4 layers
Refractive index of photoluminescent layer 110: 1.75
Thickness of photoluminescent layer 110: 80 nm
Period of periodic structure 120: 370 nm
Height of periodic structure 120: 80 nm
Refractive index of periodic structure 120: 1.5
Filling rate of periodic structure 120: 0.5
Refractive index of adjusting layer 140': 1.5

FIG. 35 shows that if the wavelength of propagating light is 560 nm, and the thickness of the adjusting layer 140' ranges from approximately 100 to 200 nm or approximately 270 to 380 nm, the emission intensity is high. Under this condition, the effective optical path length of the periodic structure 120 is $n_p \times h_p \times f = 1.5 \times 80$ nm$\times 0.5 = 60$ nm, the effective optical path length of the photoluminescent layer 110 is $1.75 \times 80 = 140$ nm, and the effective optical path length of the adjusting layer 140' ranges from 150 to 300 nm. Thus, the effective optical path length of the light-transmissive structure 320a is in the range of 350 nm$<d_T<$500 nm or 605 nm$<d_T<$770 nm. This relationship is in good agreement with the range represented by the formula (20) in which $m_T=2$ or 3.

When the thickness of the adjusting layer 140', which is a constituent of the light-transmissive structure 320a, is adjusted such that the effective optical path length of the light-transmissive structure 320a satisfies the formula (19), the light-transmissive structure 320a can have improved optical transparency as a whole, and the light-emitting device 301 can have improved emission efficiency. Thus, the thicknesses of the photoluminescent layer 110 and the periodic structure 120 can be set (optimized) so as to increase the luminous efficiency due to the quasi-guided mode, and the thickness of the adjusting layer 140' can be independently adjusted to improve the optical transparency of the light-transmissive structure 320a as a whole. Thus, an improvement in luminous efficiency due to the quasi-guided mode and an improvement in optical transparency can be simultaneously achieved.

Figure 36:
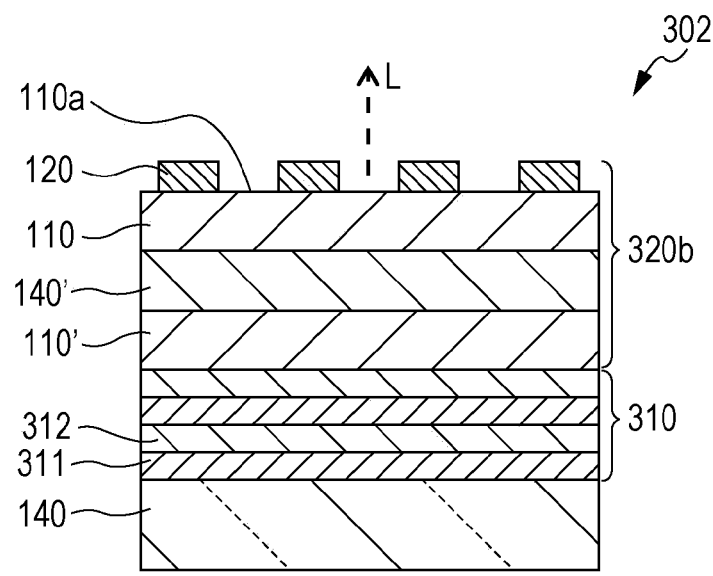
FIG. 36 is a schematic view of a light-emitting device including a multilayer mirror according to another embodiment.

FIG. 36 is a cross-sectional view of a light-emitting device 302 according to another second example of the present embodiment. Like reference numerals denote like parts in FIGS. 31, 34, and 36. A light-transmissive structure 320b includes photoluminescent layers 110 and 110' and an adjusting layer 140'. In this case, the effective optical path length $d_T'$ of the light-transmissive structure 320b is the sum of the effective optical path lengths of the photoluminescent layers 110 and 110' and the adjusting layer 140'. A multilayer mirror 310 is located between the light-transmissive structure 320b and a transparent substrate 140.

Figure 37:
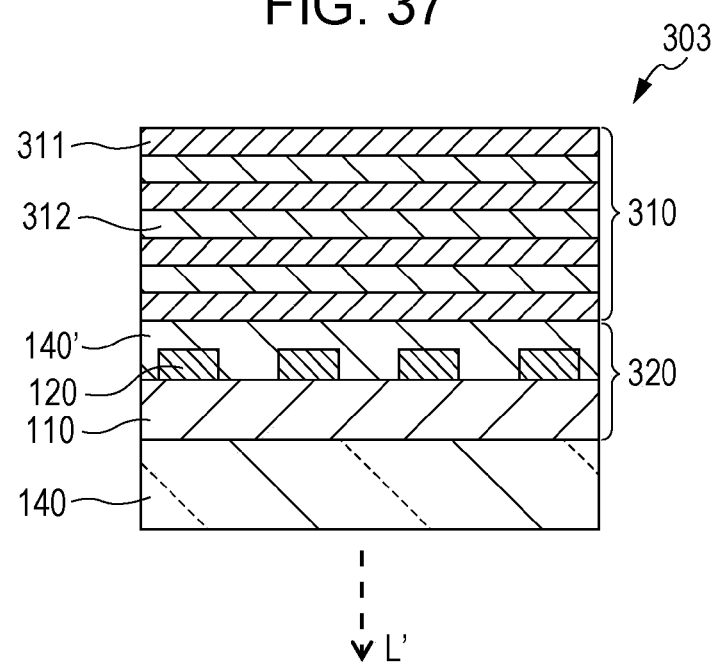
FIG. 37 is a schematic view of a light-emitting device including a multilayer mirror according to another embodiment.

FIG. 37 is a cross-sectional view of a light-emitting device 303 according to another third example of the present embodiment. Like reference numerals denote like parts in FIGS. 31, 34, 36, and 37. The light-emitting device 303 includes a multilayer mirror 310 on a light-transmissive structure 320. A transparent substrate 140 may support the multilayer mirror 310, and the multilayer mirror 310 may be located between the transparent substrate 140 and the light-transmissive structure 320. The transparent substrate 140 may be substituted by an air layer.

An adjusting layer 140' is located on the light-transmissive structure 320 and covers the texture of the periodic structure 120. The adjusting layer 140' has a flat main surface. The multilayer mirror 310 is located on the main surface. The light-transmissive structure 320 may further include the transparent substrate 140, and the light-transmissive structure 320 including the substrate 140 may satisfy the formula (20).

The light-emitting device 303 includes the multilayer mirror 310 on top of the light-transmissive structure 320 and can therefore emit high-intensity propagating light L' from the substrate 140.

Figure 38:
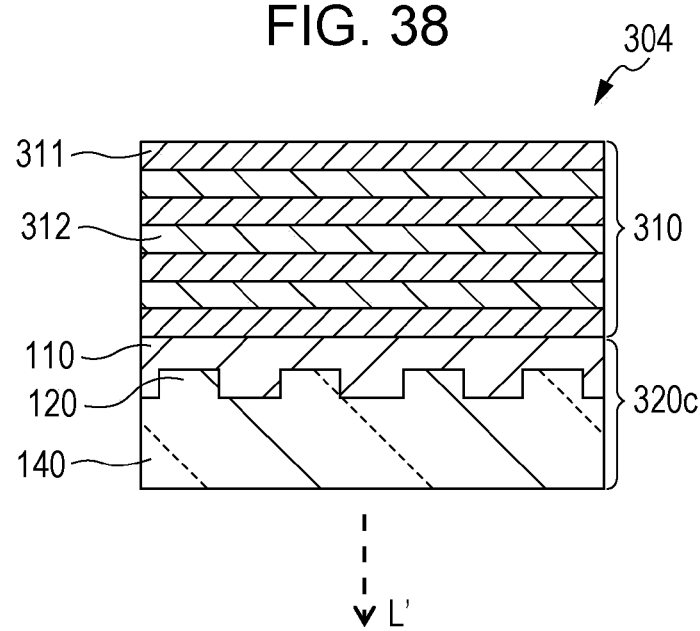
FIG. 38 is a schematic view of a light-emitting device including a multilayer mirror according to another embodiment.

FIG. 38 is a cross-sectional view of a light-emitting device 304 according to another fourth example of the present embodiment. Like reference numerals denote like parts in FIGS. 31, 34, 36, 37, and 38. Like the light-emitting device 303, the light-emitting device 304 includes a multilayer mirror 310 on a light-transmissive structure 320c. The light-transmissive structure 320c includes a transparent substrate 140 having a periodic structure 120 on its surface and a photoluminescent layer 110, which is located on the transparent substrate 140 and covers the texture of the periodic structure 120. The periodic structure 120 may be formed of the material of the transparent substrate 140. The light-transmissive structure 320c has an effective optical path length that satisfies the formula (19).

The photoluminescent layer 110 has a flat main surface opposite the transparent substrate 140. The multilayer mirror 310 is located on this main surface. Thus, the high-refractive-index layer 311 and the low-refractive-index layer 312 of the multilayer mirror 310 have a flat main surface. The high-refractive-index layer 311 and the low-refractive-index layer 312 of the multilayer mirror 310 satisfy the formula (18).

The light-emitting device 304 includes the multilayer mirror 310 on top of the light-transmissive structure 320 and can therefore emit high-intensity propagating light L' from the substrate 140.

Figure 39:
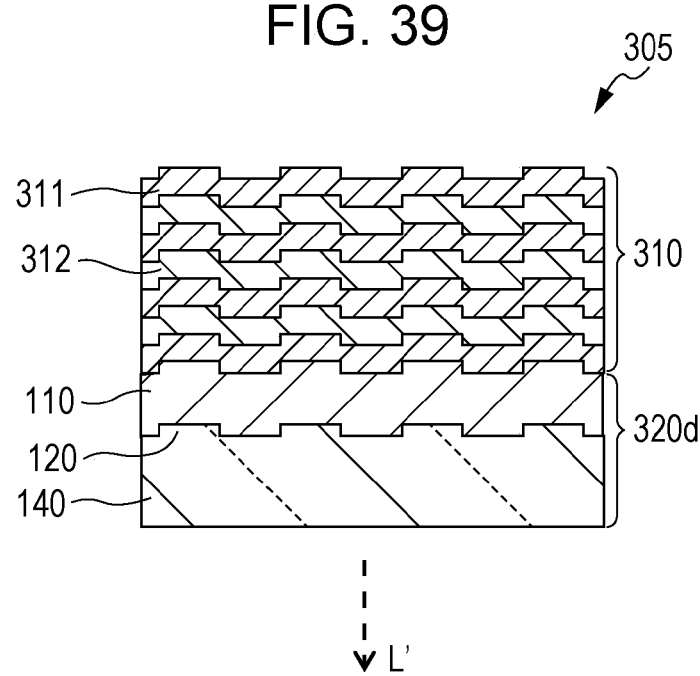
FIG. 39 is a schematic view of a light-emitting device including a multilayer mirror according to another embodiment.

FIG. 39 is a cross-sectional view of a light-emitting device 305 according to another fifth example of the present embodiment. Like reference numerals denote like parts in FIGS. 38 and 39. The light-emitting device 305 includes a photoluminescent layer 110 and a multilayer mirror 310 that have a texture mating with the texture of a periodic structure 120, and is different from the light-emitting device 304 in this point.

In the light-emitting device 305, a high-refractive-index layer 311 and a low-refractive-index layer 312 of the multilayer mirror 310 satisfy the formula (18). A light-transmissive structure 320d including the photoluminescent layer 110 and the periodic structure 120 satisfies the formula (19). Thus, like the light-emitting device 304, the light-emitting device 305 can emit high-luminescence high-intensity propagating light L' from the substrate 140.

The light-emitting devices according to the present embodiment emit propagating light beams L and L' in the direction normal to the main surface of the photoluminescent layer 110. However, a light-emitting device may emit light in a direction different from the normal direction. In such a case, a light-emitting device having the same characteristics as in the present embodiment can be produced by substituting the "optical path length" parallel to the output direction for the "thickness" in the present embodiment.

The present embodiment may be combined with various other embodiments and modified examples described before the present embodiment.

Light-emitting devices according to the present disclosure can be used to provide directional light-emitting apparatuses and can be applied to optical devices, such as lighting fixtures, displays, and projectors.

What is claimed is:
1. A light-emitting device comprising:
a photoluminescent layer having a first surface perpendicular to a thickness direction thereof, an area of the first surface being larger than a sectional area of the photoluminescent layer perpendicular to the first surface;
a light-transmissive layer located on the photoluminescent layer, at least one of the photoluminescent layer and the light-transmissive layer having a submicron structure; and
a multilayer mirror layered together with the photoluminescent layer and the light-transmissive layer, wherein the submicron structure has at least projections or recesses arranged perpendicular to the thickness direction of the photoluminescent layer, the photoluminescent layer emits light including first light having a wavelength $\lambda_a$ in air, at least one of the photoluminescent layer and the light-transmissive layer has a light emitting surface perpendicular to the thickness direction of the photoluminescent layer, the first light being emitted from the light emitting surface, a distance $D_{int}$ between adjacent projections or recesses and a refractive index $n_{wav-a}$ of the photoluminescent layer for the first light satisfy $\lambda_a/n_{wav-a} < D_{int} < \lambda_a$, and a thickness of the photoluminescent layer, the refractive index $n_{wav-a}$, and the distance $D_{int}$ are set to limit a directional angle of the first light emitted from the light emitting surface.

2. The light-emitting device according to claim 1, wherein the multilayer mirror includes low-refractive-index layers and high-refractive-index layers having a higher refractive index than the low-refractive-index layers, and the low-refractive-index layers and the high-refractive-index layers are alternately stacked on top of one another.

3. The light-emitting device according to claim 2, wherein refractive indices $n_L$ and $n_H$ of the low-refractive-index layers and the high-refractive-index layers, respectively, and thicknesses $t_{ML}$ and $t_{MH}$ of the low-refractive-index layers and the high-refractive-index layers, respectively, satisfy the following formulae:

$$(2m_R - 1.2)\lambda_a/(4n_L) \le t_{ML} \le (2m_R - 0.8)\lambda_a/(4n_L), \text{ and}$$

$$(2m_R - 1.2)\lambda_a/(4n_H) \le t_{MH} \le (2m_R - 0.8)\lambda_a/(4n_H),$$

wherein $m_R$ is a positive integer.

4. The light-emitting device according to claim 1, wherein the high-refractive-index layers are formed of a material same as that of the photoluminescent layer.

5. The light-emitting device according to claim 3, wherein $m_R$ is 1.

6. The light-emitting device according to claim 1, wherein the light-transmissive layer has the submicron structure, and the photoluminescent layer is located between the light-transmissive layer and the multilayer mirror.

7. The light-emitting device according to claim 1, further comprising an adjusting layer between the multilayer mirror and the photoluminescent layer.

8. The light-emitting device according to claim 7, further comprising:

a transparent substrate for supporting the photoluminescent layer; and an adjusting layer, wherein the first surface of the photoluminescent layer is a flat main surface, the light-transmissive layer is located on the flat main surface of the photoluminescent layer and has the submicron structure, the adjusting layer is located on the photoluminescent layer and covers the light-transmissive layer, and the multilayer mirror is located on the adjusting layer.

9. The light-emitting device according to claim 1, wherein the light-transmissive layer is a transparent substrate having the submicron structure on a surface thereof, the photoluminescent layer is located on a surface of the transparent substrate so as to cover the submicron structure, and the multilayer mirror is located on the photoluminescent layer.

10. The light-emitting device according to claim 9, wherein the first surface of the photoluminescent layer is a flat main surface opposite the transparent substrate.

11. The light-emitting device according to claim 9, wherein the first surface of the photoluminescent layer is a textured main surface opposite the transparent substrate, the textured main surface mating with the projections or recesses of the submicron structure, and the multilayer mirror has a texture mating with the projections or recesses of the submicron structure.

12. The light-emitting device according to claim 1, comprising a light-transmissive structure including the photoluminescent layer and the light-transmissive layer, wherein the multilayer mirror is in contact with the light-transmissive structure, and the light-transmissive structure has a higher refractive index than the multilayer mirror at the interface between the multilayer mirror and the light-transmissive structure, and the light-transmissive structure has an effective optical path length $d_T$ in the stacking direction that satisfies the following formula:

$$(4m_T - 1)\lambda_a/(8n_{wav-a}) < d_T < (4m_T + 1)\lambda_a/(8n_{wav-a}),$$

wherein $m_T$ is a positive integer.

13. The light-emitting device according to claim 1, comprising a light-transmissive structure including the photoluminescent layer and the light-transmissive layer, wherein the multilayer mirror is in contact with the light-transmissive structure, and the light-transmissive structure has a lower refractive index than the multilayer mirror at the interface between the multilayer mirror and the light-transmissive structure, and the light-transmissive structure has an effective optical path length $d_T$ in the stacking direction that satisfies the following formula:

$$(4m_T - 3)\lambda_a/(8n_{wav-a}) < d_T < (4m_T - 1)\lambda_a/(8n_{wav-a}),$$

wherein $m_T$ is a positive integer.

14. The light-emitting device according to claim 12, wherein $m_T$ is 1.

15. A light-emitting device comprising:

a light-transmissive layer having a submicron structure;

a photoluminescent layer located on the submicron structure; and a multilayer mirror layered together with the photoluminescent layer and the light-transmissive layer, wherein the photoluminescent layer has a first surface perpendicular to a thickness direction thereof, an area of the first surface being larger than a sectional area of the photoluminescent layer perpendicular to the first surface, the submicron structure includes at least one periodic structure having at least projections or recesses arranged perpendicular to the thickness direction of the photoluminescent layer, the photoluminescent layer emits light including first light having a wavelength $\lambda_a$ in air, at least one of the photoluminescent layer and the light-transmissive layer has a light emitting surface perpendicular to the thickness direction of the photoluminescent layer, the first light being emitted from the light emitting surface, a refractive index $n_{wav-a}$ of the photoluminescent layer for the first light and a period $p_a$ of the at least one periodic structure satisfy $\lambda_a/n_{wav-a} < p_a < \lambda_a$, and a thickness of the photoluminescent layer, the refractive index $n_{wav-a}$, and the period $p_a$ are set to limit a directional angle of the first light emitted from the light emitting surface.

16. A light-emitting device comprising:

a photoluminescent layer having a first surface perpendicular to a thickness direction thereof, an area of the first surface being larger than a sectional area of the photoluminescent layer perpendicular to the first surface;

a light-transmissive layer having a higher refractive index than the photoluminescent layer; and a multilayer mirror layered together with the photoluminescent layer and the light-transmissive layer, wherein the light-transmissive layer has a submicron structure including at least one periodic structure comprising at least projections or recesses arranged perpendicular to the thickness direction of the photoluminescent layer, the photoluminescent layer emits light including first light having a wavelength $\lambda_a$ in air, at least one of the photoluminescent layer and the light-transmissive layer has a light emitting surface perpendicular to the thickness direction of the photoluminescent layer, the first light being emitted from the light emitting surface, a refractive index $n_{wav-a}$ of the photoluminescent layer for the first light and a period $p_a$ of the at least one periodic structure satisfy $\lambda_a/n_{wav-a} < p_a < \lambda_a$, and a thickness of the photoluminescent layer, the refractive index $n_{wav-a}$, and the period $p_a$ are set to limit a directional angle of the first light emitted from the light emitting surface.

17. The light-emitting device according to claim 1, wherein the photoluminescent layer is in contact with the light-transmissive layer.

18. A light-emitting device comprising:

a photoluminescent layer having a submicron structure; and a multilayer mirror layered together with the photoluminescent layer, wherein the photoluminescent layer has a first surface perpendicular to a thickness direction thereof, an area of the first surface being larger than a sectional area of the photoluminescent layer perpendicular to the first surface, the submicron structure includes at least one periodic structure having at least projections or recesses arranged perpendicular to the thickness direction of the photoluminescent layer, the photoluminescent layer emits light including first light having a wavelength $\lambda_a$ in air, the photoluminescent layer has a light emitting surface perpendicular to the thickness direction of the photoluminescent layer, the first light being emitted from the light emitting surface, a refractive index $n_{wav-a}$ of the photoluminescent layer for the first light and a period $p_a$ of the at least one periodic structure satisfy $\lambda_a/n_{wav-a} < p_a < \lambda_a$, and a thickness of the photoluminescent layer, the refractive index $n_{wav-a}$, and the period $p_a$ are set to limit a directional angle of the first light emitted from the light emitting surface.

19. The light-emitting device according to claim 1, wherein the submicron structure has both the projections and the recesses.

20. A light-emitting apparatus comprising:

the light-emitting device according to claim 1; and an excitation light source for irradiating the photoluminescent layer with excitation light.

21. The light-emitting device according to claim 1, wherein the photoluminescent layer includes a phosphor.

22. The light-emitting device according to claim 1, wherein 380 nm $\leq \lambda_a \leq$ 780 nm is satisfied.

23. The light-emitting device according to claim 1, wherein the thickness of the photoluminescent layer, the refractive index $n_{wav-a}$, and the distance $D_{int}$ are set to allow an electric field to be formed in the photoluminescent layer, in which antinodes of the electric field are located in areas, the areas each corresponding to respective one of the projections and/or recesses.

24. The light-emitting device according to claim 1, wherein the light-transmissive layer is located indirectly on the photoluminescent layer.

25. The light-emitting device according to claim 1, wherein the thickness of the photoluminescent layer, the refractive index $n_{wav-a}$, and the distance $D_{int}$ are set to allow an electric field to be formed in the photoluminescent layer, in which antinodes of the electric field are located at, or adjacent to, at least the projections or recesses.

* * * * *